United States Patent
Takamoto et al.

(10) Patent No.: US 9,196,533 B2
(45) Date of Patent: Nov. 24, 2015

(54) FILM FOR BACK SURFACE OF FLIP-CHIP SEMICONDUCTOR, DICING-TAPE-INTEGRATED FILM FOR BACK SURFACE OF SEMICONDUCTOR, PROCESS FOR PRODUCING SEMICONDUCTOR DEVICE, AND FLIP-CHIP SEMICONDUCTOR DEVICE

(75) Inventors: Naohide Takamoto, Osaka (JP); Goji Shiga, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 310 days.

(21) Appl. No.: 13/642,229

(22) PCT Filed: Apr. 18, 2011

(86) PCT No.: PCT/JP2011/059558
§ 371 (c)(1),
(2), (4) Date: Jan. 2, 2013

(87) PCT Pub. No.: WO2011/132648
PCT Pub. Date: Oct. 27, 2011

(65) Prior Publication Data
US 2013/0095639 A1    Apr. 18, 2013

(30) Foreign Application Priority Data

Apr. 20, 2010  (JP) ................ 2010-097229
Apr. 20, 2010  (JP) ................ 2010-097236
Apr. 20, 2010  (JP) ................ 2010-097240

(51) Int. Cl.
*H01L 21/00* (2006.01)
*H01L 23/28* (2006.01)
(Continued)

(52) U.S. Cl.
CPC . *H01L 21/78* (2013.01); *C09J 7/02* (2013.01); *H01L 21/6836* (2013.01);
(Continued)

(58) Field of Classification Search
USPC ........... 438/460–465; 257/678–733, 787–796
See application file for complete search history.

(56) References Cited

U.S. PATENT DOCUMENTS 6,919,262 B2    7/2005  Senoo et al.
7,235,465 B2    6/2007  Senoo et al.
(Continued)

FOREIGN PATENT DOCUMENTS

CN    102947929 A    2/2013
JP    2000-063773 A    2/2000
(Continued)

OTHER PUBLICATIONS

Office Action dated Nov. 8, 2013, issued by the Japanese Patent Office in counterpart Japanese Application No. 2010-097229.
(Continued)

*Primary Examiner* — Karen Kusumakar
(74) *Attorney, Agent, or Firm* — Sughrue Mion, PLLC

(57) ABSTRACT

The present invention relates to a film for back surface of flip-chip semiconductor, which is to be formed on a back surface of a semiconductor element flip-chip connected onto an adherend, wherein an amount of shrinkage of the film for back surface of flip-chip semiconductor due to thermal curing is 2% by volume or more and not more than 30% by volume relative to a total volume of the film for back surface of flip-chip semiconductor before the thermal curing. According to the film for back surface of flip-chip semiconductor according to the present invention, since it is formed on the back surface of a semiconductor element having been flip-chip connected onto an adherend, it fulfills a function to protect the semiconductor element. In addition, in the film for back surface of flip-chip semiconductor according to the present invention, since an amount of shrinkage due to thermal curing is 2% by volume or more relative to a total volume of the film for back surface of flip-chip semiconductor before the thermal curing, a warp of a semiconductor element to be generated at the time of flip-chip connecting the semiconductor element onto an adherend can be effectively suppressed or prevented.

8 Claims, 2 Drawing Sheets

(51) Int. Cl.
- *H01L 23/29* (2006.01)
- *H01L 21/78* (2006.01)
- *H01L 21/683* (2006.01)
- *C09J 7/02* (2006.01)
- *H01L 23/00* (2006.01)
- *H01L 21/56* (2006.01)

(52) U.S. Cl.
CPC ......... *C09J 2203/326* (2013.01); *H01L 21/563* (2013.01); *H01L 23/293* (2013.01); *H01L 24/13* (2013.01); *H01L 24/16* (2013.01); *H01L 24/81* (2013.01); *H01L 2221/68377* (2013.01); *H01L 2224/13111* (2013.01); *H01L 2224/13144* (2013.01); *H01L 2224/13147* (2013.01); *H01L 2224/16225* (2013.01); *H01L 2224/16238* (2013.01); *H01L 2224/16258* (2013.01); *H01L 2224/73204* (2013.01); *H01L 2224/812* (2013.01); *H01L 2224/81007* (2013.01); *H01L 2224/81801* (2013.01); *H01L 2924/0102* (2013.01); *H01L 2924/01004* (2013.01); *H01L 2924/01019* (2013.01); *H01L 2924/01025* (2013.01); *H01L 2924/01057* (2013.01); *H01L 2924/01079* (2013.01); *H01L 2924/3025* (2013.01); *H01L 2924/351* (2013.01); *Y10T 428/14* (2015.01)

(56) References Cited

U.S. PATENT DOCUMENTS

| | | | |
|---|---|---|---|
| 7,408,259 B2 | 8/2008 | Senoo et al. | |
| 2002/0046860 A1* | 4/2002 | Xu et al. | 174/52.2 |
| 2002/0137309 A1* | 9/2002 | Senoo et al. | 438/460 |
| 2003/0064579 A1* | 4/2003 | Miyakawa et al. | 438/628 |
| 2004/0104326 A1 | 6/2004 | Demel et al. | |
| 2005/0184402 A1 | 8/2005 | Senoo et al. | |
| 2005/0186762 A1 | 8/2005 | Senoo et al. | |
| 2006/0102987 A1 | 5/2006 | Saiki et al. | |
| 2008/0260982 A1 | 10/2008 | Senoo et al. | |
| 2009/0053518 A1 | 2/2009 | Saiki et al. | |
| 2010/0112272 A1 | 5/2010 | Hirano et al. | |
| 2010/0276796 A1* | 11/2010 | Andry et al. | 257/692 |
| 2012/0052269 A1 | 3/2012 | Hirano et al. | |
| 2013/0099394 A1 | 4/2013 | Takamoto et al. | |

FOREIGN PATENT DOCUMENTS

| | | |
|---|---|---|
| JP | 2001-134916 A | 5/2001 |
| JP | 2001-135598 A | 5/2001 |
| JP | 2002-280329 A | 9/2002 |
| JP | 2004063551 A | 2/2004 |
| JP | 2004072108 A | 3/2004 |
| JP | 2004142430 A | 5/2004 |
| JP | 2004214288 A | 7/2004 |
| JP | 2004221169 A | 8/2004 |
| JP | 2005-26311 A | 1/2005 |
| JP | 2005302971 A | 10/2005 |
| JP | 2006140348 A | 6/2006 |
| JP | 2007-106933 A | 4/2007 |
| JP | 2007158026 A | 6/2007 |
| JP | 2007250970 A | 9/2007 |
| JP | 2007261035 A | 10/2007 |
| JP | 2008006386 A | 1/2008 |
| JP | 2008166451 A | 7/2008 |
| JP | 2008-248128 A | 10/2008 |
| JP | 2009-130320 A | 6/2009 |
| TW | 533532 A | 5/2003 |
| TW | 200821368 A | 5/2008 |

OTHER PUBLICATIONS

Office Action dated Nov. 8, 2013, issued by the Japanese Patent Office in counterpart Japanese Application No. 2010-097236.
Office Action dated Nov. 8, 2013, issued by the Japanese Patent Office in counterpart Japanese Application No. 2010-097240.
International Search Report for PCT/JP2011/059558 dated May 24, 2011 [PCT/ISA/210].
Written Opinion for PCT/JP2011/059558 dated May 24, 2011 [PCT/ISA/237].
Notification dated Aug. 29, 2013, issued by the Japanese Patent Office in corresponding Application No. 2010-097236.
Office Action dated Jul. 19, 2013, issued by the Japanese Patent Office in counterpart Japanese Application No. 2010-097229.
Decision of Refusal, dated Jan. 28, 2014, issued by the Japanese Patent Office in counterpart Japanese Application No. 2010-097229.
Decision of Refusal, dated Jan. 28, 2014, issued by the Japanese Patent Office in counterpart Japanese Application No. 2010-097236.
Decision of Refusal, dated Jan. 28, 2014, issued by the Japanese Patent Office in counterpart Japanese Application No. 2010-097240.
Office Action dated Dec. 15, 2014, issued by the State Intellectual Property Office of P.R. China in counterpart Chinese Application No. 201180030498.0.
Pretrial Report dated May 13, 2014, issued by the Japanese Intellectual Property Office in counterpart Japanese Application No. 2010-097229.
Pretrial Report dated May 13, 2014, issued by the Japanese Intellectual Property Office in counterpart Japanese Application No. 2010-097236.
Pretrial Report dated May 13, 2014, issued by the Japanese Intellectual Property Office in counterpart Japanese Application No. 2010-097240.
Office Action dated Apr. 20, 2015, issued by the Taiwanese Intellectual Property Office in counterpart Taiwanese Application No. 100113778.
Notification of Second Office Action dated Aug. 12, 2015 issued by the State Intellectual Property Office of P.R. China in counterpart Chinese Patent Application No. 201180030498.0.

* cited by examiner (a)

(b)

(c)

(d)

US 9,196,533 B2

FILM FOR BACK SURFACE OF FLIP-CHIP SEMICONDUCTOR, DICING-TAPE-INTEGRATED FILM FOR BACK SURFACE OF SEMICONDUCTOR, PROCESS FOR PRODUCING SEMICONDUCTOR DEVICE, AND FLIP-CHIP SEMICONDUCTOR DEVICE

TECHNICAL FIELD

The present invention relates to a film for back surface of flip-chip semiconductor and a dicing tape-integrated film for back surface of semiconductor. The film for back surface of flip-chip semiconductor is used for the purposes of protecting a back surface of a semiconductor element such as a semiconductor chip, etc. and improving strength thereof, and the like. In addition, the present invention relates to a method for manufacturing a semiconductor device using a dicing tape-integrated film for back surface of semiconductor and a flip-chip-mounted semiconductor device.

BACKGROUND ART

In recent years, thinning and miniaturization of a semiconductor device and its package have been increasingly demanded. Therefore, as the semiconductor device and its package, flip-chip semiconductor devices in which a semiconductor element such as a semiconductor chip, etc. is mounted (flip-chip connected) on a substrate by means of flip-chip bonding have been widely utilized. In such flip-chip connection, a semiconductor chip is fixed to a substrate in a form where a circuit face of the semiconductor chip is opposed to an electrode-formed face of the substrate. In such a semiconductor device or the like, there may be the case where the back surface of the semiconductor chip is protected with a protective film to prevent the semiconductor chip from damaging or the like.

PRIOR ART DOCUMENTS

Patent Documents

Patent Document 1: JP-A-2008-166451
Patent Document 2: JP-A-2008-006386
Patent Document 3: JP-A-2007-261035
Patent Document 4: JP-A-2007-250970
Patent Document 5: JP-A-2007-158026
Patent Document 6: JP-A-2004-221169
Patent Document 7: JP-A-2004-214288
Patent Document 8: JP-A-2004-142430
Patent Document 9: JP-A-2004-072108
Patent Document 10: JP-A-2004-063551

SUMMARY OF THE INVENTION

Problems to be Solved by the Invention

However, for the purpose of protecting the back surface of a semiconductor chip with the foregoing protective film, it is required to add a new step of sticking a protective film onto a back surface of a semiconductor chip obtained in a dicing step. As a result, the number of processing steps increases, so that the manufacturing costs and the like increase. In addition, the resent tendency toward thinning may possibly bring about a problem in that the semiconductor chips are damaged in a picking-up step of the semiconductor chips. Accordingly, until the picking-up step, semiconductor wafers or semiconductor chips are required to be reinforced for the purpose of increasing the mechanical strength thereof. In particular, there may be the case where a warp is generated on the semiconductor chip due to thinning of the semiconductor chip, and suppression or prevention thereof is demanded.

In view of the foregoing problems, the present invention has been made, and an object thereof is to provide a film for back surface of flip-chip semiconductor and a dicing tape-integrated film for back surface of semiconductor, each of which is able to suppress or prevent the generation of a warp on a semiconductor element having been flip-chip connected onto an adherend.

In addition, another object of the present invention is to provide a method for manufacturing a semiconductor device in which a semiconductor dement can be flip-chip connected onto an adherend while suppressing the generation of a warp, resulting in making it possible to improve the yield.

Means For Solving the Problems

In order to solve the foregoing conventional problems, the inventors of the present application made extensive and intensive investigations. As a result, it has been found that by controlling an amount of shrinkage of a film for back surface of flip-chip semiconductor due to thermal curing, the generation of a warp on a semiconductor element having been flip-chip connected onto an adherend can be reduced, leading to accomplishment of the present invention.

Specifically, the film for back surface of flip-chip semiconductor according to the present invention is a film for back surface of flip-chip semiconductor, which is to be formed on the back surface of a semiconductor element flip-chip connected onto an adherend, wherein an amount of shrinkage of the film for back surface of flip-chip semiconductor due to thermal curing is 2% by volume or more and not more than 30% by volume relative to a total volume of the film for back surface of flip-chip semiconductor before the thermal curing.

In flip-chip mounting, it is general that a molding resin for encapsulating the whole of a semiconductor package is not used, but only a bump connecting portion between an adhered and a semiconductor element is encapsulated with an encapsulating resin called an underfill. Therefore, the back surface of the semiconductor element is bared. Here, for example, at the time of thermal curing of the encapsulating resin, there may be the case where a stress is applied to the semiconductor element due to the cure shrinkage, and a warp is generated due to this stress on the semiconductor element. In particular, in thin semiconductor elements having a thickness of not more than 300 μm (furthermore, a thickness of not more than 200 μm), the generation of such a warp becomes remarkable.

According to the film for back surface of flip-chip semiconductor according to the present invention, when it is formed on the back surface of a semiconductor element having been flip-chip connected onto an adherend, it fulfills a function to protect the semiconductor element. In addition, in the film for back surface of flip-chip semiconductor according to the present invention, an amount of shrinkage of the film for back surface of flip-chip semiconductor due to thermal curing is 2% by volume or more relative to a total volume of the film before thermal curing, and therefore, at the time of thermal curing of an encapsulating resin as described above, the film cures and shrinks at the same time. In consequence, a stress capable of cancelling or relieving the foregoing stress acting on the semiconductor element can be applied to the semiconductor element. As a result, a warp of the semiconductor element can be effectively suppressed or prevented. In addition, by regulating the foregoing amount of shrinkage to not more than 30% by volume, it can be correlated with an amount of shrinkage of the underfill. Incidentally, the back surface of the semiconductor element as referred to herein means a face on the opposite side to a face on which a circuit is formed.

In addition, the film for back surface of flip-chip semiconductor according to the present invention preferably contains at least a thermosetting resin. By containing at least a thermosetting resin, the film for back surface of semiconductor can effectively exhibit a fraction as an adhesive layer.

In addition, it is preferable that the film for back surface of flip-chip semiconductor according to the present invention contains a thermosetting resin, and a content of the thermosetting resin is 40% by weight or more and not more than 90% by weight relative to whole resin components in the film for back surface of flip-chip semiconductor.

When the film for back surface of flip-chip semiconductor according to the present invention contains a thermosetting resin and the content of the thermosetting resin is 40% by weight or more relative to whole resin components in the film for back surface of flip-chip semiconductor, the film for back surface of flip-chip semiconductor can be considerably shrunken to some extent due to thermal curing. As a result, at the time of thermal curing of an encapsulating resin as described above, the film cures and shrinks at the same time. In consequence, a stress capable of cancelling or relieving the foregoing stress acting on the semiconductor element can be applied to the semiconductor element. As a result, a warp of the semiconductor element can be effectively suppressed or prevented. In addition, when the content of the thermosetting resin is 40% by weight or more, at the time of thermally curing the encapsulating resin, the film for back surface of semiconductor can be sufficiently thermally cured and is surely adhered and fixed onto the back surface of the semiconductor element, whereby it becomes possible to manufacture a flip-chip semiconductor device which is free from peeling off. In addition, by regulating the content of the thermosetting resin to be not more than 90% by weight, it is possible to effectively fabricate a film for back surface of flip-chip semiconductor with a moderate amount of shrinkage.

In addition, it is preferable that the film for back surface of flip-chip semiconductor according to the present invention contains a thermosetting resin and a thermal curing-accelerating catalyst, and a proportion of the thermal curing-accelerating catalyst is 1.5% by weight or more and not more than 20% by weight relative to a total amount of the thermosetting resin.

When the film for back surface of flip-chip semiconductor according to the present invention contains a thermosetting resin and a thermal curing-accelerating catalyst, and a proportion of the thermal curing-accelerating catalyst is 1.5% by weight or more relative to a total amount of the thermosetting resin, the film for back surface of flip-chip semiconductor can be considerably shrunken to some extent due to thermal curing. As a result, at the time of thermal curing of an encapsulating resin as described above, the film cures and shrinks at the same time. In consequence, a stress capable of cancelling or relieving the foregoing stress acting on the semiconductor element can be applied to the subject semiconductor element. As a result, a warp of the semiconductor element can be effectively suppressed or prevented. In addition, when the proportion of the thermal curing-accelerating catalyst is 1.5% by weight or more, at the time of thermally curing the encapsulating resin, the film for back surface of semiconductor can be sufficiently thermally cured and is surely adhered and fixed onto the back surface of the semiconductor element, whereby it becomes possible to manufacture a flip-chip semiconductor device which is free from peeling off. In addition, by regulating the proportion of the thermal curing-accelerating catalyst to be not more than 20% by weight, the amount of shrinkage of the film for back surface of flip-chip semiconductor does not become excessive but can be controlled to a moderate degree.

A thickness of the film for back surface of flip-chip semiconductor preferably falls within the range of from 2 µm to 200 µm. By regulating the foregoing thickness to be 2 µm or more, it is possible to improve the mechanical strength of the subject film, thereby ensuring favorable self-supporting properties. On the other hand, by regulating the foregoing thickness to be not more than 200 µm, it is possible to realize thinning of a semiconductor device including a semiconductor element having been flip-chip mounted on an adherend.

A thickness of the semiconductor element preferably falls within the range of from 20 µm to 300 µm.

In addition, the dicing tape-integrated film for back surface of semiconductor according to the present invention is a dicing tape-integrated film for back surface of semiconductor which includes a dicing tape including a base material and a pressure-sensitive adhesive layer laminated on the base material; and the foregoing film for back surface of flip-chip semiconductor laminated on the dicing tape, wherein the dicing tape-integrated film for back surface of semiconductor is laminated on the pressure-sensitive adhesive layer.

In the dicing tape-integrated film for bank surface of semiconductor having the foregoing configuration, the dicing tape and the film for back surface of flip-chip semiconductor are integrally formed, and therefore, the film can also be subjected to a dicing step of dicing a semiconductor wafer to fabricate a semiconductor element and a subsequent picking-up step. That is, at the time of sticking the dicing tape onto the back surface of the semiconductor wafer prior to the dicing step, the film for back surface of semiconductor can also be stuck, and therefore, a step of sticking only the film for back surface of semiconductor (a sticking step of the film for back surface of semiconductor) is not necessary. As a result, it may be contrived to decrease the number of processing steps. Moreover, since the film for back surface of semiconductor protects the back surface of the semiconductor wafer or the semiconductor element formed by dicing, it is possible to reduce or prevent the generation of damage (cracking, chipping, or the like) of the semiconductor element in the dicing step or subsequent steps (picking-up step and the like). As a result, it may be contrived to improve a manufacturing yield of flip-chip semiconductor device.

In addition, the method for manufacturing a semiconductor device according to the present invention is a method for manufacturing a semiconductor device using the foregoing dicing tape-integrated film for back surface of semiconductor, which includes a step of sticking a semiconductor wafer onto the film for back surface of flip-chip semiconductor in the dicing tape-integrated film for back surface of semiconductor; a step of dicing the semiconductor wafer to form a semiconductor element; a step of peeling off the semiconductor element together with the film for back surface of flip-chip semiconductor from the pressure-sensitive adhesive layer of the dicing tape; and a step of flip-chip connecting the semiconductor element onto an adherend.

In the foregoing method, the dicing tape-integrated film for back surface of semiconductor is stuck onto the back surface of the semiconductor wafer, and therefore, a step of sticking only the film for back surface of semiconductor (a sticking step of the film for back surface of semiconductor) is not necessary. In addition, in dicing of the semiconductor wafer or picking-up of the semiconductor element formed by dicing, the semiconductor wafer and the back surface of the semiconductor element are protected by the film for back surface of semiconductor, and therefore, the generation of damage or the like can be prevented. As a result, a flip-chip semiconductor device can be manufactured while improving a manufacturing yield.

In the step of flip-chip connection, it is preferable to include a step of encapsulating an encapsulating resin in a gap between the semiconductor element flip-chip bonded onto the adherend and the adherend, followed by thermally curing the encapsulating resin.

At the time of thermal curing of the encapsulating resin, there may be the case where a stress is applied to the semiconductor element due to the cure shrinkage, and a warp is generated on the semiconductor element due to this stress. In particular, in thin semiconductor elements having a thickness of not more than 300 μm (furthermore, a thickness of not more than 200 μm), the generation of such a warp becomes remarkable. However, according to the foregoing method, since a film for back surface of flip-chip semiconductor having an amount of shrinkage due to thermal curing of 2% by volume or more relative to a total volume of the film for back surface of flip-chip semiconductor before thermal curing is used, at the time of thermal curing of the encapsulating resin, the film for back surface of semiconductor also causes cure shrinkage. According to this, a stress which is applied to the semiconductor element due to the cure shrinkage of the encapsulating resin can be cancelled or relieved, and the generation of a warp of the semiconductor element can be suppressed or prevented.

In addition, when a film for back surface of flip-chip semiconductor containing a thermosetting resin, with a content of the thermosetting resin being 40% by weight or more relative to whole resin components in the film for back surface of flip-chip semiconductor, is used, at the time of thermally curing due encapsulating resin, the film for back surface of semiconductor also causes cure shrinkage. According to this, a stress which is applied to the semiconductor element due to the cure shrinkage of the encapsulating resin can be cancelled or relieved, and the generation of a warp of the semiconductor element can be suppressed or prevented. In addition, when a film for back surface of flip-chip semiconductor having the content of the thermosetting resin of 40% by weight or more is used, at the time of thermally curing the encapsulating resin, the film for back surface of semiconductor can be sufficiently thermally cured and is surely adhered and fixed onto the back surface of the semiconductor element. Thus, it becomes possible to manufacture a flip-chip semiconductor device which is free from peeling off.

In addition, when a film for back surface of flip-chip semiconductor containing a thermosetting resin and a thermal curing-accelerating catalyst, with a proportion of the thermal curing-accelerating catalyst being 1.5% by weight or more relative to a total amount of the thermosetting resin, is used, at the time of thermal curing of the encapsulating resin, the film for back surface of semiconductor also causes cure shrinkage. According to this, a stress which is applied to the semiconductor element due to the cure shrinkage of the encapsulating resin can be cancelled or relieved, and the generation of a warp of the semiconductor element can be suppressed or prevented. In addition, when a film for back surface of flip-chip semiconductor having the proportion of the thermal curing-accelerating catalyst of 1.5% by weight or more is used, at the time of thermally curing the encapsulating resin, the film for back surface of semiconductor can be sufficiently thermally cured and is surely adhered and fixed onto the back surface of the semiconductor element, whereby it becomes possible to manufacture a flip-chip semiconductor device which is free from peeling off.

In addition, the flip-chip semiconductor device according to the present invention is one manufactured by the manufacturing method of a semiconductor device as described above.

ADVANTAGES OF THE INVENTION

According to the film for back surface of flip-chip semiconductor according to the present invention, since it is formed on the back surface of a semiconductor element having been flip-chip connected onto an adherend, it fulfills a function to protect the semiconductor element. In addition, since the film for back surface of flip-chip semiconductor according to the present invention has an amount of shrinkage due to thermal curing of 2% by volume or more relative to a total volume of the film for back surface of flip-chip semiconductor before thermal curing, a warp of the semiconductor element to be generated at the time of flip-chip connection of the semiconductor element onto the adherend can be effectively suppressed or prevented.

In addition, when the film for back surface of flip-chip semiconductor according to the present invention contains a thermosetting resin, and a content of the thermosetting resin is 40% by weight or more relative to whole resin components in the film for back surface of flip-chip semiconductor, a warp of the semiconductor element to be generated at the time of flip-chip connection of the semiconductor element onto the adherend can be particularly effectively suppressed or prevented.

In addition, when the film for back surface of flip-chip semiconductor according to the present invention contains a thermosetting resin and a thermal curing-accelerating catalyst, and a content of the thermal curing-accelerating catalyst is 1.5% by weight or more relative to a total amount of the thermosetting resin, a warp of the semiconductor element to be generated at the time of flip-chip connection of the semiconductor element onto the adherend can be particularly effectively suppressed or prevented.

In addition, according to the dicing tape-integrated film for back surface of semiconductor according to the present invention, the dicing tape and the film for back surface of flip-chip semiconductor are integrally formed with each other, and therefore, it can also be subjected to a dicing step of dicing a semiconductor wafer to fabricate a semiconductor element and a subsequent picking-up step. As a result, a step of sticking only the film for back surface of semiconductor (a sticking step of the film for back surface of semiconductor) is not necessary. Furthermore, in the subsequent dicing step or picking-up step, the film for back surface of semiconductor is stuck onto the back surface of the semiconductor wafer or the back surface of the semiconductor element formed by dicing, and therefore, the semiconductor wafer or semiconductor element can be effectively protected, and the generation of damage of the semiconductor element can be suppressed or prevented. In addition, at the time of flip-chip connection of the semiconductor element onto the adherend, the generation of a warp of the semiconductor dement can be prevented.

Furthermore, according to the method for manufacturing a semiconductor device of the present invention, the dicing tape-integrated film for back surface of semiconductor is stuck onto the back surface of the semiconductor wafer, and therefore, a step of sticking only the film for back surface of semiconductor is not necessary. In addition, in dicing of the semiconductor wafer or picking-up of the semiconductor element formed by dicing, the back surface of each of the semiconductor wafer and the semiconductor element is protected by the film for back surface of semiconductor, and therefore, the generation of damage or the like can be prevented. In addition, at the time of flip-chip connection of the semiconductor element onto the adherend, the generation of a warp of the semiconductor element can be prevented. As a result, a flip-chip semiconductor device can be manufactured while improving a manufacturing yield.

MODES FOR CARRYING OUT THE INVENTION

Figure 1:
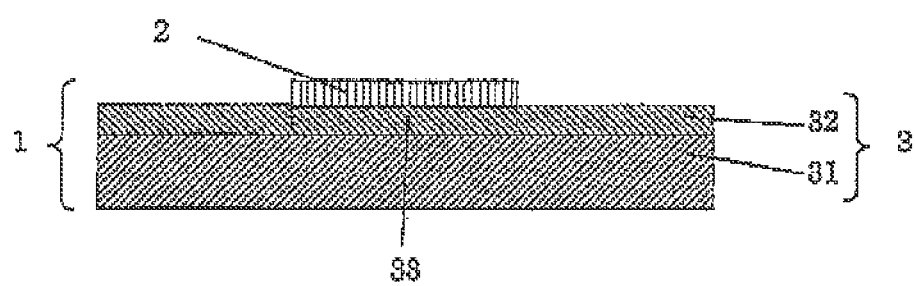
FIG. 1 is a cross-sectional schematic view showing an example of a dicing tape-integrated film for back surface of semiconductor according to the present invention.

An embodiment of the present invention is described by reference to FIG. 1, but it should not be construed that the present invention is limited thereto. FIG. 1 is a cross-sectional schematic view showing an example of a dicing tape-integrated film for back surface of semiconductor according to the present embodiment. Incidentally, in the present description, in the drawings, portions which are unnecessary for the explanation are omitted, and some portions are illustrated enlargedly or contractedly for the purpose of making it easy to explain.

(Dicing Tape-integrated Film For Back Surface of Semiconductor)

As shown in FIG. 1, a dicing tape-integrated film 1 for back surface of semiconductor is configured to include a dicing tape 3 having a pressure-sensitive adhesive layer 32 provided on a base material 31; and a film 2 for back surface of flip-chip semiconductor (hereinafter also referred to as "film for back surface of semiconductor") provided on the pressure-sensitive adhesive layer. In addition, as shown in FIG. 1, though the dicing tape-integrated film for back surface of semiconductor according to the present invention may be configured such that the film 2 for back surface of semiconductor is formed only in a portion 33 corresponding to a sticking portion of a semiconductor wafer, it may also be configured such that the film for back surface of semiconductor is formed on the whole surface of the pressure-sensitive adhesive layer 32; or it may also be configured such that the film for back surface of semiconductor is formed in a portion which is larger than the portion 33 corresponding to a sticking portion of a semiconductor wafer and smaller than the whole surface of the pressure-sensitive adhesive layer 32. Incidentally, the surface of the film 2 for back surface of semiconductor (the surface on the side to be stuck on the back surface of the wafer) may be protected by a separator or the like during a period until the film is stuck onto the back surface of the wafer.

(Film For Back Surface of Flip-chip Semiconductor)

The film 2 for back surface of semiconductor has a film-shaped form. The film 2 for back surface of semiconductor is usually in an uncured state (inclusive of a semi-cured state) in a form of the dicing tape-integrated film for back surface of semiconductor as a product, and after sticking the dicing tape-integrated film for back surface of semiconductor onto the semiconductor wafer, the film 2 for back surface of semiconductor is thermally cured (detail of which are described later).

The film 2 for back surface of semiconductor according to the present embodiment has such a characteristic that its amount of shrinkage due to thermal curing (hereinafter also referred to as "amount of thermal curing shrinkage") is 2% by volume or more and not more than 30% by volume relative to a total volume of the film 2 for back surface of semiconductor before thermal curing. When the amount of thermal curing shrinkage is 2% by volume or more, even if the semiconductor element having been flip-chip connected onto the adherend is of a thin type (for example, even if the thickness is not more than 300 µm, and further not more than 200 µm), its warp can be effectively suppressed or prevented. In the flip-chip connection, after flip-chip bonding the semiconductor element onto the adherend, only a connecting portion between the adherend and the semiconductor element is encapsulated with an encapsulating material (an encapsulating resin called an underfill, or the like). Furthermore, while the encapsulating material is thermally cured, a stress (stress due to cure shrinkage) is applied to the semiconductor element by cure shrinkage of the encapsulating material on that occasion, or the like, thereby generating a warp. However, according to the film 2 for back surface of semiconductor according to the present embodiment, since the amount of thermal curing shrinkage is 2% by volume or more, at the time of thermally curing the encapsulating material, the film causes cure shrinkage together with the encapsulating material. According to this, it becomes possible to also apply a stress to the semiconductor element from the film 2 for back surface of semiconductor, and the stress due to cure shrinkage of the encapsulating material can be cancelled or relieved. As a result, the generation of a warp of the semiconductor element can be suppressed or prevented. In addition, by regulating the amount of thermal curing shrinkage to be not more than 30% by volume, it is possible to produce a moderate amount of shrinkage corresponding to the amount of shrinkage of the encapsulating material. A lower limit value of the amount of thermal curing shrinkage of the film 2 for back surface of semiconductor is preferably 3% by volume or more (more preferably 3.5% by volume or more). In addition, an upper limit value of the amount of thermal curing shrinkage of the film 2 for back surface of semiconductor is preferably not more than 20% by volume (more preferably not more than 10% by volume).

Here, though the film for back surface of semiconductor may be a single layer or a laminated film in which plural layers are laminated, in the case where the film for back surface of semiconductor is a laminated film, it is sufficient that the amount of thermal curing shrinkage is in the range of 2% by volume or more and not more 30% by volume as a whole of the laminated film. The amount of thermal curing shrinkage of the film for back surface of semiconductor can be controlled by the kind of a thermosetting resin and its content, or the like. Incidentally, the amount of thermal curing shrinkage of the film for back surface of semiconductor can be measured according to the method described in the Examples.

The film for back surface of semiconductor is preferably formed of at least a thermosetting resin, and more preferably formed of at least a thermosetting resin and a thermoplastic resin. By forming the film for back surface of semiconductor from at least a thermosetting resin, the film for back surface of semiconductor can effectively exhibit a function as an adhesive layer.

Examples of the thermoplastic resin include natural rubber, butyl rubber, isoprene rubber, chloroprene rubber, an ethylene-vinyl acetate copolymer, an ethylene-acrylic acid copolymer, an ethylene-acrylic acid ester copolymer, a polybutadiene resin, a polycarbonate resin, a thermoplastic polyimide resin, a polyamide resin such as 6-nylon, 6,6-nylon, etc., a phenoxy resin, an acrylic resin, a saturated polyester resin such as PET (polyethylene terephthalate), PBT (polybutylene terephthalate), etc., a polyamide-imide resin, a fluorine resin, and the like. The thermoplastic resin can be used solely or in combination of two or more kinds thereof. Among these thermoplastic resins, an acrylic resin which contains a small amount of ionic impurities, has high heat resistance, and is capable of securing reliability of a semiconductor element is especially preferable.

The acrylic resin is not particularly limited, and examples thereof include polymers composed of, as a component(s), one kind or two or more kinds of esters of acrylic acid or methacrylic acid having a linear or branched alkyl group having a carbon number of not more than 30 (preferably a carbon number of from 4 to 18, more preferably a carbon number of from 6 to 10, and especially preferably a carbon number of 8 or 9), and the like. That is, the acrylic resin as referred to in the present invention has a broad meaning of also including a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (lauryl group), a tridecyl group, a tetradecyl group, a stearyl group, an octadecyl group, and the like.

In addition, other monomer for forming the acrylic resin (monomer other than the alkyl ester of acrylic acid or methacrylic acid, in which a carbon number of the alkyl group thereof is not more than 30) is not particularly limited, and examples thereof include caxboxyl group-containing monomers such as acrylic acid, methacrylic acid, carboxyethyl acrylate, carboxypentyl acrylate, itaconic acid, maleic acid, fumaric acid, crotonic acid, etc.; acid anhydride monomers such as maleic anhydride, itaconic anhydride, etc.; hydroxyl group-containing monomers such as 2-hydroxyethyl (meth) acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, (4-hydroxymethylcyclohexyl)-methyl acrylate, etc.; sulfonic acid group-containing monomers such as styrenesulfonic acid, allylsulfonic acid, 2-(meth)acrylamido-2-methylpropanesulfonic acid, (meth) acrylamidopropanesulfonic acid, sulfopropyl (meth)acrylate, (meth)acryloyloxynaphthalenesulfonic acid, etc.; phosphoric acid group-containing monomers such as 2-hydroxyethylacryloyl phosphate, etc.; and the like. Incidentally, the (meth) acrylic acid as referred herein means acrylic acid and/or methacrylic acid, and the term "(meth)" as referred to in the present invention has the same meanings in all of the occurrences.

In addition, examples of the thermosetting resin include, in addition to epoxy resins and phenol resins, amino resins, unsaturated polyester resins, polyurethane resins, silicone resins, thermosetting polyimide resins, and the like. The thermosetting resin can be used solely or in combination of two or more kinds thereof. As the thermosetting resin, epoxy resins having a low content of ionic impurities and the like, which corrode the semiconductor element, are especially suitable. In addition, a phenol resin can be suitably used as a curing agent of the epoxy resin.

The epoxy resin is not particularly limited. For example, bifunctional epoxy resin or polyfunctionl epoxy resins such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an o-cresol novolak type epoxy resin, a trishydroxyphenylmethane type epoxy resin, a tetraphenylolethane type epoxy resin, etc., or epoxy resins such as a hydantoin type epoxy resin, a trisglycidylisocyanurate type epoxy resin, a glycidylamine type epoxy resin, etc. can be used.

As the epoxy resin, among those exemplified above, a novolak type epoxy resin, a biphenyl type epoxy resin, a trishydroxyphenylmethane type epoxy resin, and a tetraphenylolethane type epoxy resin are especially preferable. This is because these epoxy resins are rich in reactivity with a phenol resin as a curing agent and excellent in heat resistance, or the like.

Furthermore, the phenol resin acts as a curing agent of the epoxy resin, and examples thereof include novolak type phenol resins such as a phenol novolak resin, a phenol aralkyl resin, a cresol novolak resin, a tert-butylphenol novolak resin, a nonylphenol novolak resin, etc.; resol type phenol resins; polyoxystyrenes such as poly-p-oxystyrene, etc., and the like. The phenol resin can be used solely or in combination of two or more kinds thereof. Among these phenol resins, a phenol novolak resin and a phenol aralkyl resin are especially preferable. This is because connection reliability of the semiconductor device can be improved.

As for a blending proportion of the epoxy resin and the phenol resin, for example, the resins are suitably blended such that a hydroxyl group in the phenol resin is from 0.5 equivalents to 2.0 equivalents per equivalent of the epoxy group in the epoxy resin component. The blending proportion is more suitably from 0.8 equivalents to 1.2 equivalents. That is, this is because when the blending proportion falls outside the foregoing range, a curing reaction does not proceed sufficiently, and the characteristics of the epoxy resin cured product are liable to be deteriorated.

A content of the thermosetting resin is preferably 5% by weight or more, more preferably 10% by weight or more, still more preferably 15% by weight or more, especially preferably 40% by weight or more, and yet still more preferably 50% by weight or more relative to whole resin components in the film for back surface of semiconductor. By regulating the foregoing content to 5% by weight or more, it is possible to make it easy to regulate the amount of thermal curing shrinkage to 2% by volume or more. In addition, at the time of thermally curing the encapsulating resin, the film for back surface of semiconductor can be sufficiently thermally cured and is surely adhered and fixed onto the back surface of the semiconductor element. Thus, it becomes possible to manufacture a flip-chip semiconductor device which is free from peeling off. On the other hand, the content of the thermosetting resin is preferably not more than 90% by weight, more preferably not more than 85% by weight, and still more preferably not more than 80% by weight relative to whole resin components in the film for back surface of semiconductor. By regulating the foregoing content to not more than 90% by weight, a favorable film can be obtained.

An especially preferred range of the content of the thermosetting resin is 40% by weight or more and not more than 90% by weight relative to whole resin components in the film for back surface of semiconductor. When the content of the thermosetting resin is 40% by weight or more, even if the semiconductor element having been flip-chip connected onto the adherend is of a thin type (for example, even if the thickness is not more than 300 µm, and further not more than 200 µm), its warp can be effectively suppressed or prevented. In the flip-chip connection, after flip-chip bonding the semiconductor element onto the adherend, only a connecting portion between the adherend and the semiconductor element is encapsulated with an encapsulating material (an encapsulating resin called an underfill, or the like). Furthermore, while the encapsulating material is thermally cured, a stress is applied to the semiconductor element by cure shrinkage of the encapsulating material on that occasion, or the like, and a warp is generated. However, when the content of the thermosetting resin is 40% by weight or more, at the time of thermally curing the encapsulating material, the film causes considerable cure shrinkage to some extent together with the encapsulating material. According to this, it becomes possible to also apply a stress (stress due to cure shrinkage) to the semiconductor element from the film 2 for back surface of semiconductor, and the stress due to cure shrinkage of the encapsulating material can be cancelled or relieved. As a result, the generation of a warp of the semiconductor element can be suppressed or prevented. In addition, when the content of the thermosetting resin is 40% by weight or more, at the time of thermally curing the encapsulating material, the film for back surface of semiconductor can also be sufficiently thermally cured and is surely adhered and fixed onto the back surface of the semiconductor element. Thus, it becomes possible to manufacture a flip-chip semiconductor device which is free from peeling off. In addition, by regulating the content of the thermosetting resin to not more than 90% by weight, it is possible to effectively fabricate a film for back surface of flip-chip semiconductor with a moderate amount of shrinkage.

Here, though the film for back surface of semiconductor may be a single layer or a laminated film in which plural layers are laminated, in the case where the film for back surface of semiconductor is a laminated film, it is sufficient that the content of the thermosetting resin is in the range of 40% by weight or more and not more than 90% by weight as a whole of the laminated film.

In the present invention, it is preferable that the film for back surface of semiconductor contains a thermal curing-accelerating catalyst together with a thermosetting resin. The thermal curing-accelerating catalyst is not particularly limited, and it can is properly selected and used among known thermal curing-accelerating catalysts. The thermal curing-accelerating catalyst can be used solely or in combination of two or more kinds thereof. As the thermal curing-accelerating catalyst, for example, an amine based curing accelerator, a phosphorus based curing accelerator, an imidazole based curing accelerator, a boron based curing accelerator, a phosphorus-boron based curing accelerator, and the like can be used.

The amine based curing accelerator is not particularly limited, and examples thereof include monoethanolamine trifluoroborate (manufactured by Stella Chemifa Corporation), dicyandiamide (manufactured by Nacalai Tesque, Inc.), and the like.

The phosphorus based curing accelerator is not particularly limited, and examples thereof include triorganophosphines such as triphenylphosphine, tributylphosphine, tri(p-methylphenyl)phosphine, tri(nonylphenyl)phospine, diphenyltolylphosphine, etc.; and tetraphenylphosphonium bromide (a trade name: TPP-PB), methyltriphenylphosphonium (a trade name: TPP-MB), methyltriphenylphosphonium chloride (a trade name: TPP-MC), methoxymethyltriphenylphosphonium (a trade name: TPP-MOC), benzyltriphenylphosphonium chloride (a trade name: TPP-ZC), and the like (all of which are manufactured by Hokko Chemical Industry Co., Ltd.). In addition, the triphenylphosphine based compound is preferably a compound which is substantially insoluble in epoxy resins. When the compound is insoluble in epoxy resins, it is possible to suppress the excessive progress of thermal curing. As a heat-curing catalyst which has a triphenylphosphine structure and which is substantially insoluble in epoxy resins, for example, methyltriphenylphosphonium (a trade name: TPP-MB) and the like can be exemplified. Incidentally, the term "insoluble" means that the heat-curing catalyst composed of a triphenylphosphine based compound is insoluble in a solvent composed of an epoxy resin, and in more detail the catalyst does not dissolve in the solvent in an amount of 10% by weight or more at a temperature in the range of from 10 to 40° C.

Examples of the imidazole based curing accelerator includes 2-methylimidazole (a trade name: 2MZ), 2-undecylimidazole (a trade name: C11-Z), 2-heptadecylimidazole (a trade name: C17Z), 1,2-dimethylimidazole (a trade name: 1,2DMZ). 2-ethyl-4-methylimidazole (a trade name: 2E4MZ), 2-phenylimidazole (a trade name: 2PZ), 2-phenyl-4-methylimidazole (a trade name: 2P4MZ), 1-benzyl-2-methylimidazole (a trade name: 1B2MZ), 1-benzyl-2-phenylimidazole (a trade name: 1B2PZ), 1-cyanoethyl-2-methylimidazole (a trade name: 2MZ-CN), 1-cyanoethyl-2-undecylimidazole (a trade name: C11Z-CN), 1-cyanoethyl-2-phenylimidazolium trimellitate (a trade name: 2PZCNS-PW), 2,4-diamino-6-[2'-methylimidazolyl-(1')]-ethyl-s-triazine (a trade name: 2MZ-A), 2,4-diamino-6-[2'-undecylimidazolyl-(1')]-ethyl-s-triazine (a trade name: C11Z-A), 2,4-diamino-6-[2'-ethyl-4'-methylimidazolyl-(1')]-ethyl-s-triazine (a trade name: 2E4MZ-A), a 2,4-diamino-6-[2'-methylimidazolyl-(1')]-ethyl-s-triazine isocyanuric acid adduct (a trade name: 2MA-OK), 2-phenyl-4,5-dihydroxymethylimidazole (a trade name: 2PHZ-PW), 2-phenyl-4-methyl-5-hydroxymethylimidazole (a trade name: 2P4MHZ-PW), and the like (all of which are manufactured by Shikoku Chemicals Corporation).

The boron based curing accelerator is not particularly limited, and examples thereof include trichloroborane and the like.

The phosphorus-boron based curing accelerator is not particularly limited, and examples thereof include tetraphenylphosphonium tetraphenyl borate (a trade name: TPP-K), tetraphenylphosphonium tetra-p-triborate (a trade name: TPP-MK), benzyltriphenylphosphoninm tetraphenyl borate (a trade name: TPP-ZK), triphenylphosphine triphenylborane (a trade name: TPP-S), and the like (all of which are manufactured by Hokko Chemical Industry Co., Ltd.).

A proportion of the thermal curing-accelerating catalyst is preferably 1.5% by weight or more and not more than 20% by weight relative to a total amount of the thermosetting resin. When the proportion of the thermal curing-accelerating catalyst is 1.5% by weight or more, even if the semiconductor element having been flip-chip connected onto the adherend is of a thin type (for example, even if the thickness is not more than 300 µm, and further not more than 200 µm), its warp can be effectively suppressed or prevented. In the flip-chip connection, after flip-chip bonding the semiconductor element onto the adherend, only a connecting portion between the adherend and the semiconductor element is encapsulated with an encapsulating material (an encapsulating resin called an underfill, or the like). Furthermore, while the encapsulating material is thermally cured, a stress is applied to the semiconductor element by cure shrinkage of the encapsulating material on that occasion, or the like, and a warp is generated. However, when the proportion of the thermal curing-accelerating catalyst in the film 2 for back surface of semiconductor is 1.5% by weight or more, at the time of thermally curing the encapsulating material, the film causes considerable cure shrinkage to some extent together with the encapsulating material. According to this, it becomes possible to also apply a stress to the semiconductor element front the film 2 for back surface of semiconductor, and the stress due to cure shrinkage of the encapsulating material can be cancelled or relieved. As a result, the generation of a warp of the semiconductor element can be suppressed or prevented. In addition, when the proportion of the thermal curing-accelerating catalyst is 1.5% by weight or more, at the time of thermally curing the encapsulating material, the film for back surface of semiconductor can also be sufficiently thermally cured and is surely adhered and fixed onto the back surface of the semiconductor element. Thus, it becomes possible to manufacture a flip-chip semiconductor device which is free from peeling off. In addition, by regulating the proportion of the thermal curing-accelerating catalyst to not more than 20% by weight, the amount of shrinkage of the film for back surface of flip-chip semiconductor does not become excessive but can be controlled to a moderate degree. A lower limit value of the proportion of the thermal curing-accelerating catalyst is more preferably 2% by weight or more. In addition, an upper limit value thereof is preferably not more than 10% by weight (more preferably not more than 5% by weight). Incidentally, in the present invention, when occasion demands, the proportion of the thermal curing-accelerating catalyst may be not more than 1.5% by weight relative to a total amount of the thermosetting resin. In such case, it is important that a lower limit value of the proportion of the thermal curing-accelerating catalyst is, for example, 0.01% by weight or more (more preferably 0.1% by weight or more) relative to a total amount of the thermosetting resin.

Here, though the film for back surface of semiconductor may be a single layer or a laminated film in which plural layers are laminated, in the case where the film for back surface of semiconductor is a laminated film, it is sufficient that the proportion of the thermal curing-accelerating catalyst is in the range of 1.5% by weight or more and not more than 20% by weight as a whole of the laminated film relative to a total amount of the thermosetting resin.

In addition, in the case where the film for back surface of semiconductor contains a thermal curing-accelerating catalyst, a content of the thermosetting resin is preferably 40% by weight or more and not more than 90% by weight, more preferably 50% by weight or more and not more than 90% by weight, and still more preferably 60% by weight or more and not more than 90% by weight relative to whole resin components in the film for back surface of semiconductor. By regulating the foregoing content to 40% by weight or more, it is possible to make it easy to regulate the amount of thermal curing shrinkage to 2% by volume or more. In addition, at the time of thermally curing the encapsulating resin, the film for back surface of semiconductor can be sufficiently thermally cured and is surely adhered and fixed onto the back surface of the semiconductor element. Thus, it becomes possible to manufacture a flip-chip semiconductor device which is free from peeling off. On the other hand, by regulating the foregoing content to not more than 90% by weight, it is possible to impart flexibility to the film.

The film for back surface of semiconductor is suitably formed of a resin composition containing an epoxy resin and a phenol resin, or a resin composition containing an epoxy resin, a phenol resin, and an acrylic resin. These resins have a small amount of ionic impurities and have high heat resistance, and therefore, they are able to secure reliability of the semiconductor element.

The film 2 for back surface of semiconductor has adhesiveness (adhesion) to the back surface (circuit-non-formed face) of the semiconductor wafer. Such film 2 for back surface of semiconductor can be, for example, formed of a resin composition containing an epoxy resin as the thermosetting resin. For the purpose of crosslinking the film 2 for back surface of semiconductor to some extent in advance, a polyfunctional compound capable of reacting with a molecular chain terminal functional group or the like of a polymer is preferably added as a crosslinking agent at the time of fabrication. According to this, it is possible to contrive to enhance adhesive characteristics under high temperatures and to improve heat resistance.

An adhesive force of the film for back surface of semiconductor to the semiconductor wafer (23° C., peeling angle: 180°, peeling rate: 300 mm/min) is preferably in the range of from 0.5 N/20 mm to 15 N/20 mm, and more preferably in the range of from 0.7 N/20 mm to 10 N/20 mm. By regulating the adhesive force to 0.5 N/20 mm or more, the film for back surface of semiconductor is stuck to the semiconductor wafer or the semiconductor element with excellent adhesion and can be prevented from the generation of lifting or the like. In addition, at the time of dicing of the semiconductor wafer, the generation of chip flying out can be prevented. On the other hand, by regulating the adhesive force to not more than 15 N/20 mm, the film for back surface of semiconductor can be easily peeled off from the dicing tape.

The crosslinking agent is not particularly limited, and known crosslinking agents can be used. Specifically, examples thereof include, in addition to isocyanate based crosslinking agents, epoxy based crosslinking agents, melamine based crosslinking agents, and peroxide based crosslinking agents, urea based crosslinking agents, metal alkoxide based crosslinking agents, metal chelate based crosslinking agents, metal salt based crosslinking agents, carbodiimide based crosslinking agents, oxazoline based crosslinking agents, aziridine based crosslinking agents, amine based crosslinking agents, and the like. As the crosslinking agent, isocyanate based crosslinking agents and epoxy based crosslinking agents are suitable. In addition, the crosslinking agent can be used solely or in combination of two or more kinds thereof.

Examples of the isocyanate based crosslinking agent include lower aliphatic polyisocyanates such as 1,2-ethylene diisocyanate, 1,4-butylene diisocyanate, 1,6-hexamethylene diisocyanate, etc.; alicyclic polyisocyanates such as cyclopentylene diisocyanate, cyclohexylene diisocyanate, isophorone diisocyanate, hydrogenated tolylene diisocyanate, hydrogenated xylylene diisocyanate, etc.; aromatic polyisocyanates such as 2,4-tolylene diisocyanate, 2,6-tolylene diisocyanate, 4,4'-diphenylmethane diisocyanate, xylylene diisocyanate, etc.; and the like. Besides, a trimethylolpropane/tolylene diisocyanate trimer adduct (a trade name: "COLONATE L", manufactured by Nippon Polyurethane Industry Co., Ltd.), a trimethylolpropane/hexamethylene diisocyanate trimer adduct (a trade name "COLONATE HL", manufactured by Nippon Polyurethane Industry Co., Ltd.), and the like are also used. In addition, examples of the epoxy based crosslinking agent include N,N,N'N'-tetraglycidyl-m-xylenediamine, diglycidylamine, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropane polyglycidyl ether, diglycidyl adipate, diglycidyl o-phthalate, triglycidyl-tris(2-hydroxyethyl) isocyanurate, resorcin diglycidyl ether, and bisphenol-S-diglycidyl ether; and besides, epoxy based resins having two or more epoxy groups in a molecule thereof; and the like.

Incidentally, a use amount of the crosslinking agent is not particularly limited and can be properly selected depending upon a degree of crosslinking. Specifically, it is suitable that the use amount of the crosslinking agent is usually not more than 7 parts by weight (for example, from 0.05 parts by weight to 7 parts by weight) based on 100 parts by weight of the polymer component (particularly, a polymer having a functional group at the molecular chain end). What the use amount of the crosslinking agent is more than 7 parts by weight based on 100 parts by weight of the polymer component is not preferable because the adhesive force is lowered. Incidentally, from the viewpoint of improving the cohesive force, the use amount of the crosslinking agent is preferably 0.05 parts by weight or more based on 100 parts by weight of the polymer component.

Incidentally, in the present invention, instead of the use of the crosslinking agent or together with the use of the crosslinking agent, it is also possible to perform a crosslinking treatment upon irradiation with electron beams, ultraviolet rays, or the like.

The film for back surface of semiconductor is preferably colored. According to this, excellent marking properties and appearance can be exhibited, and it becomes possible to make a semiconductor device having a value-added appearance. In this way, since the colored film for back surface of semiconductor has excellent marking properties, information of every kind such as literal information, graphical information, etc. can be imparted by applying marking on a face on the non-circuit face side of a semiconductor element or a semiconductor device using the subject semiconductor element via the film for back surface of semiconductor by utilizing various marking methods such a printing method, a laser marking method, etc. In particular, by controlling the color of coloring, information (literal information, graphical information, etc.) applied by marking can be viewed with good visibility. In addition, since the film for back surface of semiconductor is colored, the dicing tape and the film for back surface of semiconductor can be easily distinguished from each other, and workability and the like can be improved. Furthermore, for example, as a semiconductor device, it is possible to classify products thereof by using different colors. In the case where the film for back surface of semiconductor is colored (the case where the film is neither colorless nor transparent), the color shown by coloring is not particularly limited, but for example, it is preferably a dark color such as a black, blue or red color, etc., and a black color is especially suitable.

In the present embodiment, the dark color basically means a dark color having $L^*$, as defined in the $L^*a^*b^*$ color space, of not more than 60 (from 0 to 60) [preferably not more than 50 (from 0 to 50), and more preferably not more than 40 (from 0 to 40)].

In addition, the black color basically means a black based color having $L^*$, as defined in the $L^*a^*b^*$ color space, of not more than 35 (from 0 to 35) [preferably not more than 30 (from 0 to 30), and more preferably not more than 25 (from 0 to 25)]. Incidentally, in the black color, each of $a^*$ and $b^*$, as defined in the $L^*a^*b^*$ color space, can be suitably selected according to the value of $L^*$. For example, it is suitable that both of $a^*$ and $b^*$ fall within the range of preferably from −10 to 10, more preferably from −5 to 5, and especially preferably from −3 to 3 (above all, 0 or substantially 0).

Incidentally, in the present embodiment, $L^*$, $a^*$, and $b^*$ as defined in the $L^*a^*b^*$ color space can be determined by a measurement with a color difference meter (a trade name: "CR-200", manufactured by Minolta Camera Co., Ltd; color difference meter). Incidentally, the $L^*a^*b^*$ color space is a color space recommended by the Commission Internationale de l'Eclairage (CIE) in 1976, and means a color space called CIE1976($L^*a^*b^*$) color space. Also, the $L^*a^*b^*$ color space is defined in JIS Z8729 in the Japanese Industrial Standards.

At the time of coloring of the film for back surface of semiconductor, a colorant (coloring agent) can be used according to an objective color. As such a colorant, various dark-colored colorants such as black-colored colorants, blue-colored colorants, red-colored colorants, etc. can be suitably used, and black-colored colorants are especially suitable. The colorant may be any of a pigment, a dye, or the like. The colorant can be used solely or in combination of two or more kinds thereof. Incidentally, as the dye, it is possible to use any form of a dye including an acid dye, a reactive dye, a direct dye, a disperse dye, a cationic dye, and the like. In addition, the pigment is not particularly limited, too with respect to its form and can be properly selected and used among known pigments.

In particular, when a dye is used as the colorant, the dye becomes in a state where it is dispersed uniformly or substantially uniformly by dissolution in the film for back surface of semiconductor, so that the film for back surface of semiconductor (in its turn, the dicing tape-integrated film for back surface of semiconductor) having a uniform or substantially uniform color density can be easily manufactured. Accordingly, when a dye is used as the colorant, the film for back surface of semiconductor hi the dicing tape-integrated film for back surface of semiconductor can be allowed to have a uniform or substantially uniform color density and can be enhanced with respect to marking properties and appearance properties.

The black-colored colorant is not particularly limited and can be, for example, properly selected from inorganic black-colored pigments and black-colored dyes. In addition, the black-colored colorant may be a colorant mixture in which a cyan-colored colorant (blue-green colorant), a magenta-colored colorant (red-purple colorant), and a yellow-colored colorant (yellow colorant) are mixed. The black-colored colorant can be used solely or in a combination of two or more kinds thereof. As a matter of course, the black-colored colorant can be used in combination with a colorant of a color other than black.

Specifically, examples of the black-colored colorant include carbon black (such as furnace black, channel black, acetylene black, thermal black, lamp black, etc.), graphite, copper oxide, manganese dioxide, azo based pigments (such as azomethine azo black, etc.), aniline black, perylene black, titanium black, cyanine black, active charcoal, ferrite (such as non-magnetic ferrite, magnetic ferrite, etc.), magnetite, chromium oxide, iron oxide, molybdenum disulfide, a chromium complex, a composite oxide based black pigment, an anthraquinone based organic black pigment, and the like.

In the present invention, as the black-colored colorant, black-colored dyes such as C.I. Solvent Black 3, C.I. Solvent Black 7, C.I. Solvent Black 22, C.I. Solvent Black 27, C.I. Solvent Black 29, C.I. Solvent Black 34, C.I. Solvent Black 43, C.I. Solvent Black 70, C.I. Direct Black 17, C.I. Direct Black 19, C.I. Direct Black 22, C.I. Direct Black 32, C.I. Direct Black C.I. Direct Black 38, C.I. Direct Black 51, C.I. Direct Black 71, C.I. Acid Black 1, C.I. Acid Black 2, C.I. Acid Black 24, C.I. Acid Black 26, C.I. Acid Black 31, C.I. Acid Black 48, C.I. Acid Black 52, C.I. Acid Black 107, C.I.

Acid Black 109, C.I. Acid Black 110, C.I. Acid Black 119, C.I. Acid Black 154, C.I. Disperse Black 1, C.I. Disperse Black 3, C.I. Disperse Black 10, C.I. Disperse Black 24, etc.; black-colored pigments such as C.I. Disperse Black 1, C.I. Disperse Black 7, etc.; and the tike can also be utilized.

As such black-colored colorants, for example, a trade name "Oil Black BY", a trade name "Oil Black BS", a trade name "Oil Black HBB", a trade name "Oil Black 803", a trade name "Oil Black 860", a trade name "Oil Black 5970", a trade name "Oil Black 5906", and a trade name "Oil Black 5905" (all of which are manufactured by Orient Chemical Industries Co., Ltd.), and the like are commercially available.

Examples of colorants other than the black-colored colorant include cyan-colored colorants, magenta-colored colorants, and yellow-colored colorants. Examples of the cyan-colored colorant include cyan-colored dyes such as C.I. Solvent Blue 25, C.I. Solvent Blue 36, C.I. Solvent Blue 60, C.I. Solvent Blue 70, C.I. Solvent Blue 93, C.I. Solvent Blue 95, C.I. Acid Blue 6, C.I. Acid Blue 45, etc; cyan-colored pigments such as C.I. Pigment Blue 1, C.I. Pigment Blue 2, C.I. Pigment Blue 3, C.I. Pigment Blue 15, C.I. Pigment Blue 15:1, C.I. Pigment Blue 15:2, C.I. Pigment Blue 15:3, C.I. Pigment Blue 15:4, C.I. Pigment Blue 15:5, C.I. Pigment Blue 15:6, C.I. Pigment Blue 16, C.I. Pigment Blue 17, C.I. Pigment Blue 17:1, C.I. Pigment Blue 18, C.I. Pigment Blue 22, C.I. Pigment Blue 25, C.I. Pigment Blue 56, C.I. Pigment Blue 60, C.I. Pigment Blue 63, C.I. Pigment Blue 65, C.I. Pigment Blue 66, C.I. Vat Blue 4, C.I. Vat Blue 60, C.I. Pigment Green 7, etc.; and the like.

In addition, among the magenta-colored colorants, examples of magenta-colored dyes include C.I. Solvent Red 1, C.I. Solvent Red 3, C.I. Solvent Red 8, C.I. Solvent Red 23, C.I. Solvent Red 24, C.I. Solvent Red 25, C.I. Solvent Red 27, C.I. Solvent Red 30, C.I. Solvent Red 49, C.I. Solvent Red 52, C.I. Solvent Red 58, C.I. Solvent Red 63, C.I. Solvent Red 81, C.I. Solvent Red 82, C.I. Solvent Red 83, C.I. Solvent Red 84, C.I. Solvent Red 100, C.I. Solvent Red 109, C.I. Solvent Red 111, C.I. Solvent Red 121, C.I. Solvent Red 122, C.I. Disperse Red 9, C.I. Solvent Violet 8, C.I. Solvent Violet 13, C.I. Solvent Violet 14, C.I. Solvent Violet 21, C.I. Solvent Violet 27, C.I. Disperse Violet 1, C.I. Basic Red 1, C.I. Basic Red 2, C.I. Basic Red 9, C.I. Basic Red 12, C.I. Basic Red 13, C.I. Basic Red 14, C.I. Basic Red 15, C.I. Basic Red 17, C.I. Basic Red 18, C.I. Basic Red 22, C.I. Basic Red 23, C.I. Basic Red 24, C.I. Basic Red 27, C.I. Basic Red 29, C.I. Basic Red 32, C.I. Basic Red 34, C.I. Basic Red 35, C.I. Basic Red 36, C.I. Basic Red 37, C.I. Basic Red 38, C.I. Basic Red 39, C.I. Basic Red 40, C.I. Basic Violet 1, C.I. Basic Violet 3, C.I. Basic Violet 7, C.I. Basic Violet 10, C.I. Basic Violet 14, C.I. Basic Violet 15, C.I. Basic Violet 21, C.I. Basic Violet 25, C.I. Basic Violet 26, C.I. Basic Violet 27, C.I. Basic Violet 28, and the like.

Among the magenta-colored colorants, examples of magenta-colored pigments include C.I. Pigment Red 1, C.I. Pigment Red 2, C.I. Pigment Red 3, C.I. Pigment Red 4, C.I. Pigment Red 5, C.I. Pigment Red 6, C.I. Pigment Red 7, C.I. Pigment Red 8, C.I. Pigment Red 9, C.I. Pigment Red 10, C.I. Pigment Red 11, C.I. Pigment Red 12, C.I. Pigment Red 13, C.I. Pigment Red 14, C.I. Pigment Red 15, C.I. Pigment Red 16, C.I. Pigment Red 17, C.I. Pigment Red 18, C.I. Pigment Red 19, C.I. Pigment Red 21, C.I. Pigment Red 22, C.I. Pigment Red 23, C.I. Pigment Red 30, C.I. Pigment Red 31, C.I. Pigment Red 32, C.I. Pigment Red 37, C.I. Pigment Red 38, C.I. Pigment Red 39, C.I. Pigment Red 40, C.I. Pigment Red 41, C.I. Pigment Red 42, C.I. Pigment Red 48:1, C.I. Pigment Red 48:2, C.I. Pigment Red 48:3, C.I. Pigment Red 48:4, C.I. Pigment Red 49, C.I. Pigment Red 49:1, C.I. Pigment Red 50, C.I. Pigment Red 51, C.I. Pigment Red 52, C.I. Pigment Red 52:2, C.I. Pigment Red 53:1, C.I. Pigment Red 54, C.I. Pigment Red 55, C.I. Pigment Red 56, C.I. Pigment Red 57:1, C.I. Pigment Red 58, C.I. Pigment Red 60, C.I. Pigment Red 60:1, C.I. Pigment Red 63, C.I. Pigment Red 63:1, C.I. Pigment Red 63:2, C.I. Pigment Red 64, C.I. Pigment Red 64:1, C.I. Pigment Red 67, C.I. Pigment Red 68, C.I. Pigment Red 81, C.I. Pigment Red 83, C.I. Pigment Red 87, C.I. Pigment Red 88, C.I. Pigment Red 89, C.I. Pigment Red 90, C.I. Pigment Red 92, C.I. Pigment Red 101, C.I. Pigment Red 104, C.I. Pigment Red 105, C.I. Pigment Red 106, C.I. Pigment Red 108, C.I. Pigment Red 112, C.I. Pigment Red 114, C.I. Pigment Red 122, C.I. Pigment Red 123, C.I. Pigment Red 139, C.I. Pigment Red 144, C.I. Pigment Red 146, C.I. Pigment Red 147, C.I. Pigment Red 149, C.I. Pigment Red 150, C.I. Pigment Red 151, C.I. Pigment Red 163, C.I. Pigment Red 166, C.I. Pigment Red 168, C.I. Pigment Red 170, C.I. Pigment Red 171, C.I. Pigment Red 172, C.I. Pigment Red 175, C.I. Pigment Red 176, C.I. Pigment Red 177, C.I. Pigment Red 178, C.I. Pigment Red 179, C.I. Pigment Red 384, C.I. Pigment Red 185, C.I. Pigment Red 187, C.I. Pigment Red 190, C.I. Pigment Red 193, C.I. Pigment Red 202, C.I. Pigment Red 206, C.I. Pigment Red 207, C.I. Pigment Red 209, C.I. Pigment Red 219, C.I. Pigment Red 222, C.I. Pigment Red 224, C.I. Pigment Red 238, C.I. Pigment Red 245, C.I. Pigment Violet 3, C.I. Pigment Violet 9, C.I. Pigment Violet 19, C.I. Pigment Violet 23, C.I. Pigment Violet 31, C.I. Pigment Violet 32, C.I. Pigment Violet 33, C.I. Pigment Violet 36, C.I. Pigment Violet 38, C.I. Pigment Violet 43, C.I. Pigment Violet 50, C.I. Vat Red 1, C.I. Vat Red 2, C.I. Vat Red 10, C.I. Vat Red 13, C.I. Vat Red 15, C.I. Vat Red 23, C.I. Vat Red 29, C.I. Vat Red 35, and the like.

In addition, examples of the yellow-colored colorant include yellow-colored dyes such as C.I. Solvent Yellow 19, C.I. Solvent Yellow 44, C.I. Solvent Yellow 77, C.I. Solvent Yellow 79, C.I. Solvent Yellow 81, C.I. Solvent Yellow 82, C.I. Solvent Yellow 93, C.I. Solvent Yellow 98, C.I. Solvent Yellow 103, C.I. Solvent Yellow 104, C.I. Solvent Yellow 112, C.I. Solvent Yellow 162, etc.; yellow-colored pigments such as C.I. Pigment Orange 31, C.I. Pigment Orange 43, C.I. Pigment Yellow 1, C.I. Pigment Yellow 2, C.I. Pigment Yellow 3, C.I. Pigment Yellow 4, C.I. Pigment Yellow 5, C.I. Pigment Yellow 6, C.I. Pigment Yellow 7, C.I. Pigment Yellow 10, C.I. Pigment Yellow 11, C.I. Pigment Yellow 12, C.I. Pigment Yellow 13, C.I. Pigment Yellow 14, C.I. Pigment Yellow 15, C.I. Pigment Yellow 16, C.I. Pigment Yellow 17, C.I. Pigment Yellow 23, C.I. Pigment Yellow 24, C.I. Pigment Yellow 34, C.I. Pigment Yellow 35, C.I. Pigment Yellow 37, C.I. Pigment Yellow 42, C.I. Pigment Yellow 53, C.I. Pigment Yellow 55, C.I. Pigment Yellow 65, C.I. Pigment Yellow 73, C.I. Pigment Yellow 74, C.I. Pigment Yellow 75, C.I. Pigment Yellow 81, C.I. Pigment Yellow 83, C.I. Pigment Yellow 93, C.I. Pigment Yellow 94, C.I. Pigment Yellow 95, C.I. Pigment Yellow 97, C.I. Pigment Yellow 98, C.I. Pigment Yellow 100, C.I. Pigment Yellow 101, C.I. Pigment Yellow 104, C.I. Pigment Yellow 108, C.I. Pigment Yellow 109, C.I. Pigment Yellow 110, C.I. Pigment Yellow 113, C.I. Pigment Yellow 114, C.I. Pigment Yellow 116, C.I. Pigment Yellow 117, C.I. Pigment Yellow 120, C.I. Pigment Yellow 128, C.I. Pigment Yellow 129, C.I. Pigment Yellow 133, C.I. Pigment Yellow 138, C.I. Pigment Yellow 139, C.I. Pigment Yellow 147, C.I. Pigment Yellow 150, C.I. Pigment Yellow 151, C.I. Pigment Yellow 153, C.I. Pigment Yellow 154, C.I. Pigment Yellow 155, C.I. Pigment Yellow 156, C.I. Pigment Yellow 167, C.I. Pigment Yellow 172, C.I. Pigment Yellow 173, C.I. Pigment Yellow 180, C.I. Pigment Yellow 185, C.I. Pigment Yellow 195, C.I. Vat Yellow 1, C.I. Vat Yellow 3, C.I. Vat Yellow 20, etc.; and the like.

Various colorants such as cyan-colored colorants, magenta-colored colorants, yellow-colored colorants, etc. can be used solely or in combination of two or more kinds thereof, respectively. Incidentally, in the case where two or more kinds of various colorants such as cyan-colored colorants, magenta-colored colorants, yellow-colored colorants, etc. are used, a mixing proportion (or blending proportion) of these colorants is not particularly limited and can be properly selected according to the kind of each colorant, an objective color, and the like.

In the case where the film 2 for back surface of semiconductor is colored, its colored form is not particularly limited. The film for back surface of semiconductor may be, for example, a single-layer film-shaped material having a coloring agent added thereto. In addition, the film may be a laminated film in which at least a resin layer formed of at least a thermosetting resin and a coloring agent layer are laminated. Incidentally, in the case where the film 2 for back surface of semiconductor is a laminated film of the resin layer and the coloring agent layer, the film 2 for back surface of semiconductor in a laminated form preferably has a laminated form of resin layer/coloring agent layer/resin layer. In that case, the two resin layers on the both sides of the coloring agent layer may be a resin layer having the same composition or may be a resin layer having a different composition from each other.

The film 2 for back surface of semiconductor can be preferably blended with other additives according to the need. Examples of the other additives include, in addition to a filler, a flame retardant, a silane coupling agent, and an ion trapping agent, an extender, an anti-aging agent, an antioxidant, a surfactant, and the like.

Though the filler may be either an inorganic filler or an organic filler, it is suitably an inorganic filler. By blending a filler such as an inorganic filler, etc., it is possible to contrive to impart electric conductivity to the film for back surface of semiconductor or improve the thermal conductivity, or to adjust the elastic modulus, or the like. Incidentally, the film 2 for back surface of semiconductor may be electrically conductive or non-electrically conductive. Examples of the inorganic filler include various inorganic powders composed of silica, clay, gypsum, calcium carbonate, barium sulfate, alumina oxide, beryllium oxide, ceramics such as silicon carbide, silicon nitride, etc., metals or alloys such as aluminum, copper, silver, gold, nickel, chromium, lead, tin, zinc, palladium, solder, etc., carbon, and the like. The filler can be used solely or in combination of two or more kinds thereof. Above all, the filler is suitably silica, especially fused silica. Incidentally, an average particle diameter of the inorganic filler is preferably within the range of from 0.1 μm to 80 μm. The average particle diameter of the inorganic filler can be measured, for example, by a laser diffraction type particle size distribution measurement apparatus.

A blending amount of the filler (particularly, inorganic filler) is preferably not more than 80 parts by weight (from 0 part by weight to 80 parts by weight), and especially suitably from 0 part by weight to 70 parts by weight based on 100 parts by weight of the organic resin component.

In addition, examples of the flame retardant include antimony trioxide, antimony pentoxide, brominated epoxy resins, and the like. The flame retardant can be used solely or in combination of two or more kinds thereof. Examples of the silane coupling agent include β-(3,4-epoxycyclohexyl)ethyltrimethoxysilane, γ-glycidoxypropyltrimethoxysilane, γ-glycidoxypropylmethyldiethoxysilane, and the like. The silane coupling agent can be used solely or in combination of two or more kinds thereof. Examples of the ion trapping agent include hydrotalcites, bismuth hydroxide, and the like. The ion trapping agent can be used solely or in combination of two or more kinds thereof.

The film 2 for back surface of semiconductor can be, for example, formed utilizing a customary method in which a thermosetting resin such as an epoxy resin, etc. and optionally a thermoplastic resin such as an acrylic resin, etc., and also optionally a solvent or other additives and the like are mixed to prepare a resin composition, which is then formed into a film-shaped layer. Specifically, a film-shaped layer (adhesive layer) as the film for back surface of semiconductor can be, for example, formed by a method of coating the foregoing resin composition on the pressure-sensitive adhesive layer 32 of the dicing tape; a method of coating the foregoing resin composition on an appropriate separator (such as a release paper, etc.) to form a resin layer (or an adhesive layer), which is then transferred (transcribed) onto the pressure-sensitive adhesive layer 32, or the like. Incidentally, the foregoing resin composition may be either a solution or a dispersion liquid.

Incidentally, in the case where the film 2 for back surface of semiconductor is formed of a resin composition containing a thermosetting resin such as an epoxy resin, etc., the film for back surface of semiconductor is in a state where the thermosetting resin is uncured or partially cured at a stage before the film is applied onto a semiconductor wafer. In that case, after the film is applied onto the semiconductor wafer (specifically, in general, at the time of curing the encapsulating material in a flip-chip bonding step), the thermosetting resin in the film for back surface of semiconductor is cured completely or substantially completely.

In this way, even if the film for back surface of semiconductor contains a thermosetting resin, the thermosetting resin component is in an uncured or partially cured state. Therefore, a gel fraction of the film for back surface of semiconductor is not particularly limited, but for example, it can be properly selected within the range of not more than 50% by weight (from 0% by weight to 50% by weight). Suitably, the gel fraction of the film for back surface of semiconductor is preferably not more than 30% by weight (from 0% by weight to 30% by weight), and especially preferably not more than 10% by weight (from 0% by weight to 10% by weight). As for a method of measuring the gel fraction of the film, for back surface of semiconductor, the measurement can be conducted by the following measuring method.

<Measuring Method of Gel Fraction>

About 0.1 g of a sample is sampled from the film for back surface of semiconductor and precisely weighed (weight of sample), and after the sample is wrapped in a mesh-type sheet, it is dipped in about 50 mL of toluene at room temperature for one week. Thereafter, a solvent-insoluble matter (contents in the mesh-type sheet) is taken out of the toluene and dried at 130° C. for about 2 hours, the solvent-insoluble matter after drying is weighed (weight after dipping and drying), and a gel fraction (% by weight) is then calculated according to the following expression (a).

Gel fraction (% by weight)=[(Weight after dipping and drying)/(Weight of sample)]×100     (a)

Incidentally, the gel fraction of the film for back surface of semiconductor can be controlled by the kind of a resin component and its content and the kind of a crosslinking agent and its content, and besides, heating temperature, heating time, and the like.

In the present invention, in the case where the film for back surface of semiconductor is a film-shaped material formed of a resin composition containing a thermosetting resin such as an epoxy resin, etc., adhesion to the semiconductor wafer can be effectively exhibited.

Incidentally, since cutting water is used in the dicing step of the semiconductor wafer, there may be the case where the film for back surface semiconductor absorbs moisture to have a moisture content of a normal state or more. When flip-chip bonding is performed in such a high-moisture content state, there may be the case where water vapor remains at an adhesive interface between the film 2 for back surface of semiconductor and the semiconductor wafer or its processed body (semiconductor), thereby generating lifting. In consequence, by configuring the film for back surface of semiconductor in such a manner that a core material with high moisture permeability is interposed by adhesive layers, water vapor diffuses, thereby making it possible to avoid such a problem. From such a viewpoint, a multilayered structure in which the film 2 for back surface of semiconductor is formed on one surface or both surfaces of the core material may be used as the film for back surface of semiconductor. Examples of the core material include films (for example, polyimide films, polyester films, polyethylene terephthalate films, polyethylene naphthalate films, polycarbonate films, etc.), resin substrates reinforced with a glass fiber or a plastic-made nonwoven fiber, silicon substrates, glass substrates, and the like.

A thickness (total thickness in the case of the laminated film) of the film 2 for back surface of semiconductor is not particularly limited, but it can be, for example, properly selected within the range of from about 2 to 200 μm. Furthermore, the foregoing thickness is preferably from about 4 μm to 160 μm, more preferably from about 6 μm to 100 μm, and especially preferably about 10 μm to 80 μm.

Suitably, a tensile storage elastic modulus of the film 2 for back surface of semiconductor in an uncured state at 23° C. is preferably 1 GPa or more (for example, from 1 GPa to 50 GPa), more preferably 2 GPa or more, and especially preferably 3 GPa or more. When the foregoing tensile storage elastic modulus is 1 GPa or more, sticking of the film for back surface of semiconductor to a support can be effectively suppressed or prevented at the time when after the semiconductor chip is peeled off from the pressure-sensitive adhesive layer 32 of the dicing tape together with the film 2 for back surface of semiconductor, the film 2 for back surface of semiconductor is placed on the support, and transportation or the like is performed. Incidentally, the support refers to, for example, a top tape, a bottom tape, or the like in a carrier tape. Incidentally, in the case where the film 2 for back surface of semiconductor is formed of a resin composition containing a thermosetting resin, as described above, the thermosetting resin is usually in an uncured or partially cured state, so that the elastic modulus of the film for back surface of semiconductor at 23° C. is in general an elastic modulus at 23° C. in a state where the thermosetting resin is uncured or partially cured.

Here, the film 2 for back surface of semiconductor may be either a single layer or a laminated film where plural layers are laminated. In the case of a laminated film, the tensile storage elastic modulus in an uncured state at 23° C. is sufficiently in the range of 1 GPa or more (for example, from 1 GPa to 50 GPa) as a whole of the laminated film. In addition, the tensile storage elastic modulus (at 23° C.) of the film for back surface of semiconductor in an uncured state can be controlled by properly setting up the kind of a resin component (a thermoplastic resin or a thermosetting resin) and its amount, or the kind of a filler such as a silica filler, etc. and its amount, or the like. Incidentally, in the case where the film 2 for back surface of semiconductor is a laminated film where plural layers are laminated (in the case where the film for back surface of semiconductor has a laminated layer form), as the laminated layer form, for example, a laminated layer form composed of a wafer adhesive layer and a laser marking layer, and the like can be exemplified. In addition, between the wafer adhesive layer and the laser marking layer, other layers (an interlayer, a light-shielding layer, a reinforcing layer, a colored layer, a base material layer, an electromagnetic wave-shielding layer, a thermally conductive layer, a pressure-sensitive adhesive layer, etc.) may be provided. Incidentally, the wafer adhesive layer is a layer which exhibits excellent adhesion (adhesiveness) to a wafer and is a layer which comes into contact with the back surface of the wafer. On the other hand, the laser marking layer is a layer which exhibits excellent laser marking properties and is a layer which is utilized at the time of performing laser marking on tire back surface of a semiconductor chip.

Incidentally, as for the tensile storage elastic modulus, the film 2 for back surface of semiconductor in an uncured state is fabricated without being laminated on the dicing tape 3 and then measured in a tensile mode under conditions of a sample width of 10 mm, a sample length of 22.5 mm, a sample thickness of 0.2 mm, a frequency of 1 Hz, and a temperature elevating rate of 10° C./minute in a nitrogen atmosphere at a prescribed temperature (23° C.) using a dynamic viscoelasticity measuring apparatus "Solid Analyzer RS A2", manufactured by Rheometrics Co., Ltd., and the measured elastic modulus is regarded as a value of the tensile storage elastic modulus.

In the film 2 for back surface of semiconductor, it is preferable that at least one surface thereof is protected with a separator (release liner) (not illustrated). For example, in the case of the dicing tape-integrated film 1 for back surface of semiconductor, the separator may be provided on only one surface of the film for back surface of semiconductor, whereas in the case of the film for back surface of semiconductor which is not integrated with a dicing tape, the separator may be provided on one surface or both surfaces of the film for back surface of semiconductor. The separator has a function as a protective material for protecting the film for back surface of semiconductor until it is put into practical use. In addition, in the case of the dicing tape-integrated film 1 for back surface of semiconductor, the separator can be further used as a supporting base material at the time of transferring the film 2 for back surface of semiconductor onto the pressure-sensitive adhesive layer 32 on the base material of the dicing tape. The separator is peeled off when a semiconductor wafer is stuck onto the film for back surface of semiconductor. As the separator, polyethylene, polypropylene, and a plastic film (such as polyethylene terephthalate, etc.) or paper or the like, the surface of which is coated with a release agent such as a fluorine based release agent, a long-chain alkyl acrylate based release agent, etc., can also be used. Incidentally, the separator can be formed by a conventionally known method. In addition, a thickness or the like of the separator is not particularly limited.

In the case where the film 2 for back surface semiconductor is not laminated on the dicing tape 3, the film 2 for back surface of semiconductor may be wound up in a rolled form using one separator having a release layer on both surfaces thereof, or it may be protected with a separator having a release layer on both surfaces thereof or may be protected with a separator having a release layer on at least one surface thereof.

In addition, though a light transmittance of visible light (wavelength: 400 nm to 800 nm) (visible light transmittance) in the film 2 for back surface of semiconductor is not particularly limited, for example, it is preferably in the range of not more than 20% (from 0% to 20%), more preferably not more than 10% (from 0% to 10%), and especially preferably not more than 5% (from 0% to 5%). In the film 2 for back surface of semiconductor, when the visible light transmittance is larger than 20%, there is a concern that the semiconductor element is adversely affected by passing of light. In addition, the visible light transmittance (%) can be controlled by the kind of the resin component of the film 2 for back surface of semiconductor and its content, the kind of a coloring agent (a pigment, a dye, or the like) and its content, the content of an inorganic filler, or the like.

The visible light transmittance (%) of the film 2 for back surface of semiconductor can be measured as follows. That is, a single body of the film 2 for back surface of semiconductor having a thickness (average thickness) of 20 μm is fabricated. Subsequently, the film 2 for back surface of semiconductor is irradiated with visible light having a wavelength of from 400 nm to 800 nm [apparatus: a visible light emission apparatus (trade name: "ABSORPTION SPECTRO PHOTOM-ETER"), manufactured by Shimadzu Corporation] at a prescribed intensity, and the intensity of the transmitted visible light is measured. Furthermore, a value of the visible light transmittance can be determined by a change in the intensity before and after the visible light transmits through the film 2 for back surface of semiconductor. Incidentally, it is also possible to lead out a visible light transmittance (%; wavelength: 400 nm to 800 nm) of the film 2 for back surface of semiconductor having a thickness of 20 μm from a value of a visible light transmittance (%; wavelength: 400 nm to 800 nm) of the film 2 for back surface of semiconductor having a thickness of not 20 μm. In addition, in the present invention, while the visible light transmittance (%) in the case of the film 2 for back surface of semiconductor having a thickness of 20 μm is determined, it is not the gist that the film for back surface of semiconductor according to the present invention is limited to one having a thickness of 20 μm.

In addition, as the film 2 for back surface of semiconductor, it is preferable that its coefficient of moisture absorption is lower. Specifically, the coefficient of moisture absorption is preferably not more than 1% by weight, and more preferably not more than 0.8% by weight. By regulating the coefficient of moisture absorption to not more than 1% by weight, the laser marking properties can be improved. In addition, for example, in a reflow step, the generation of a void or the like between the film 2 for back surface of semiconductor and the semiconductor element can also be suppressed or prevented. Incidentally, the coefficient of moisture absorption is a value calculated from a change in the weight before and after the film 2 for back surface of semiconductor is allowed to stand in an atmosphere at a temperature of 85° C. and a relative humidity of 85% RH for 168 hours. In the case where the film 2 for back surface of semiconductor is formed of a resin composition containing a thermosetting resin, the coefficient of moisture absorption means a value obtained when the film for back surface of semiconductor after thermal curing is allowed to stand in an atmosphere at a temperature of 85° C. and a relative humidity of 85% RH for 168 hours. In addition, the coefficient of moisture absorption can be, for example, adjusted by changing the addition amount of the inorganic filler.

In addition, as the film 2 for back surface of semiconductor, it is preferable that a proportion of a volatile matter is smaller. Specifically, a weight loss rate (proportion of weight loss) of the film 2 for back surface of semiconductor after the heat treatment is preferably not more than 1% by weight, and more preferably not more than 0.8% by weight. As for a condition of the heat treatment, for example, a heating temperature is 250° C., and a heating time is one hour. By regulating the weight loss rate to not more than 1% by weight, the laser marking properties can be improved. In addition, for example, in a reflow step, the generation of cracking in the flip-chip semiconductor device can be suppressed or prevented. The weight loss rate can be, for example, adjusted by the addition of an inorganic material capable of reducing the generation of cracking at the time of lead-free solder reflow. Incidentally, in the case where the film 2 for back surface of semiconductor is formed of a resin composition containing a thermosetting resin, the weight loss rate means a value obtained by heating the film for back surface of semiconductor after thermal curing under a condition at a heating temperature of 250° C. for a heating time of one hour.

(Dicing Tape)

The dicing tape 3 is configured such that the pressure-sensitive adhesive layer 32 is formed on the base material 31. In this way, it is sufficient that the dicing tape 3 has a configuration in which the base material 31 and the pressure-sensitive adhesive layer 32 are laminated. The base material (supporting base material) can be used as a supporting parent body for the pressure-sensitive adhesive layer 32 or the like. The base material 31 preferably has radiation-transmitting properties. As the base material 31, for example, proper thin materials, for example, paper based base materials such as paper, etc.; fiber based base materials such as fabrics, nonwoven fabrics, felts, nets, etc.; metal based base materials such as metal foils, metal plates, etc.; plastic base materials such as plastic films or sheets, etc.; rubber based base materials such as rubber sheets, etc.; foamed bodies such as foamed sheets, etc.; and laminates thereof [particularly, laminates of a plastic based base material with other base material, laminates of plastic films (or sheets) each other, etc.]; and the like can be used. In the present invention, as the base material, plastic based base materials such as plastic films or sheets, etc. can be suitably employed. Examples of raw materials for such plastic materials include olefin based resins such as polyethylene (PE), polypropylene (PP), an ethylene-propylene copolymer, etc.; copolymers composed of ethylene as a monomer component, such as an ethylene-vinyl acetate copolymer (EVA), an ionomer resin, an ethylene-(meth)acrylic acid copolymer, an ethylene-(meth)acrylic acid ester (random or alternating) copolymer, etc.; polyesters such as polyethylene terephthalate (PET), polyethylene naphthalate (PEN), polybutylene terephthalate (PBT), etc.; acrylic resins; polyvinyl chloride (PVC); polyurethanes; polycarbonates; polyphenylene sulfide (PPS); amide based resins such as polyamides (nylon), wholly aromatic polyamides (aramid), etc.; polyetheretherketones (PEEK); polyimides; polyetherimides; polyvinylidene chloride; ABS (acrylonitrile-butadiene-styrene copolymer); cellulose based resins; silicone resins; fluorinated resins; and the like.

In addition, examples of the material for the base material 31 include polymers such as crosslinked materials of the foregoing resins, and the like. The plastic film may be used without being stretched or may be used after being subjected to a uniaxial or biaxial stretching treatment, if desired. According to the resin sheet to which thermal contraction properties have been imparted by a stretching treatment or the like, an adhered area between the pressure-sensitive adhesive layer 32 and the film 2 for back surface of semiconductor is reduced by thermal contraction of the base material 31 after dicing, so that it is possible to contrive to make it easy to recover the semiconductor chip.

In order to enhance adhesion to an adjacent layer, holding properties, and the like, the surface of the base material 31 may be subjected to a customary surface treatment, for example, an oxidation treatment by a chemical or physical treatment such as a chromate treatment, ozone exposure, flame exposure, exposure to high-voltage electric shock, an ionized radiation treatment, etc., a coating treatment with an undercoating agent, or the like.

As the base material 31, the same kind or different kinds of materials can be properly selected and used. If desired, a blend of several kinds of materials can be used. In addition, in order to impart antistatic ability to the base material 31, a vapor deposition layer of an electrically conductive substance having a thickness of from about 30 to 500 angstroms, which is composed of a metal, an alloy, or an oxide thereof, can be formed on the base material 31. The base material 31 may be a single layer or a laminated layer of two or more layers.

A thickness (total thickness in the case of a laminated layer) of the base material 31 is not particularly limited, and it can be properly selected depending upon strength, flexibility, intended purpose of use, or the like. For example, the thickness is generally not more than about 1,000 μm (for example, from about 1 μm to 1,000 μm), preferably from about 10 μm to 500 μm, more preferably from about 20 μm to 300 μm, and especially preferably from about 30 μm to 200 μm. However, it should not be construed that the thickness of the base material 31 is limited thereto.

Incidentally, the base material 31 may contain various additives (a coloring agent, a filler, a plasticizer, an anti-aging agent, an antioxidant, a surfactant, a flame retardant, etc.) within the range where the effects and the like of the present invention are not impaired.

The pressure-sensitive adhesive layer 32 is formed of a pressure-sensitive adhesive and has pressure-sensitive adhesiveness. Such a pressure-sensitive adhesive is not particularly limited, and it can be properly selected among known pressure-sensitive adhesives. Specifically, as the pressure-sensitive adhesive, for example, those having the foregoing characteristics can be properly selected and used among known pressure-sensitive adhesives such as acrylic pressure-sensitive adhesives, rubber based pressure-sensitive adhesives, vinyl alkyl ether based pressure-sensitive adhesives, silicone based pressure-sensitive adhesives, polyester based pressure-sensitive adhesives, polyamide based pressure-sensitive adhesives, urethane based pressure-sensitive adhesives, fluorine based pressure-sensitive adhesives, styrene-diene block copolymer based pressure-sensitive adhesives, creep characteristics-improved pressure-sensitive adhesives prepared by blending a heat fusible resin having a melting point of not higher than about 200° C. in the foregoing pressure-sensitive adhesive (see, for example, JP-A-56-61468, JP-A-61-174857, JP-A-63-17981, JP-A-56-13040, and the like). In addition, radiation-curable pressure-sensitive adhesives (or energy ray-curable pressure-sensitive adhesives) and thermally expandable pressure-sensitive adhesives can also be used as the pressure-sensitive adhesive. The pressure-sensitive adhesive can be used solely or in combination of two or more kinds thereof.

As the pressure-sensitive adhesive, acrylic pressure-sensitive adhesives and rubber based pressure-sensitive adhesives can be suitably used, with acrylic pressure-sensitive adhesives being especially suitable. Examples of the acrylic pressure-sensitive adhesive include acrylic pressure-sensitive adhesives containing, as a base polymer, an acrylic polymer (homopolymer or copolymer) using one or two or more kinds of alkyl (meth)acrylates as a monomer component.

Examples of the alkyl (meth) acrylate in the acrylic pressure-sensitive adhesive include alkyl (meth)acrylates such as methyl (meth)acrylate, ethyl (meth)acrylate, propyl (meth) acrylate, isopropyl (meth)acrylate, butyl (meth)acrylate, isobutyl (meth)acrylate, s-butyl (meth)acrylate, t-butyl (meth)acrylate, pentyl (meth)acrylate, hexyl (meth)acrylate, heptyl (meth)acrylate, octyl (meth)acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth) acrylate, eicosyl (meth)acrylate, etc. As the alkyl (meth)acrylate, alkyl (meth)acrylates in which a carbon number of an alkyl group thereof is from 4 to 18 are suitable. Incidentally, the alkyl group of the alkyl (meth)acrylate may be either linear or branched.

Incidentally, for the purpose of improving cohesive force, heat resistance, crosslinking properties, and the like, the acrylic polymer may contain a unit corresponding to other monomer component copolymerizable with the alkyl (meth) acrylate (copolymerizable monomer component), if desired. Examples of such a copolymerizable monomer component include carboxyl group-containing monomers such as (meth) acrylic acid (acrylic acid and methacrylic acid), carboxyethyl acrylate, carboxypentyl acrylate, itaconic acid, maleic acid, fumaric acid, crotonic acid, etc.; acid anhydride group-containing monomers such as maleic anhydride, itaconic anhydride, etc.; hydroxyl group-containing monomers such as hydroxyethyl (meth)acrylate, hydroxypropyl (meth)acrylate, hydroxybutyl (meth)acrylate, hydroxyhexyl (meth)acrylate, hydroxyoctyl (meth)acrylate, hydroxydecyl (meth)acrylate, hydroxylauryl (meth)acrylate, (4-hydroxymethylcyclohexyl) methyl methacrylate, etc.; sulfonic acid group-containing monomers such as styrenesulfonic acid, allylsulfonic acid, 2-(meth)acrylamido-2-methylpropanesulfonic acid, (meth) acrylamidopropanesulfonic acid, sulfopropyl (meth)acrylate, (meth)acryloyloxynaphthalenesulfonic acid, etc.; phosphoric acid group-containing monomers such as 2-hydroxyethyl acryloylphosphate, etc.; (N-substituted) amide based monomers such as (meth)acrylamide, N,N-dimethyl(meth)acrylamide, N-butyl(meth)acrylamide, N-methylol(meth)acrylamide, N-methylolpropane(meth)acrylamide, etc.; aminoalkyl (meth)acrylate based monomers such as aminoethyl (meth)acrylate, N,N-dimethylaminoethyl (meth)acrylate, t-butylaminoethyl (meth)acrylate, etc.; alkoxyalkyl (meth)acrylate based monomers such as methoxyethyl (meth)acrylate, ethoxyethyl (meth)acrylate, etc.; cyanoacrylate monomers such as acrylontrile, methacrylonitrile, etc.; epoxy group-containing acrylic monomers such as glycidyl (meth)acrylate, etc.; styrene based monomers such as styrene, α-methylstyrene, etc.; vinyl ester based monomers such as vinyl acetate, vinyl propionate, etc.; olefin based monomers such as isoprene, butadiene, isobutylene, etc.; vinyl ether based monomers such as vinyl ether, etc.; nitrogen-containing monomers such as N-vinylpyrrolidone, methylvinylpyrrolidone, vinylpyridine, vinylpiperidone, vinylpyrimidine, vinylpiperazine, vinylpyrazines vinylpyrrole, vinylimidazole, vinyloxazole, vinylmorpholine, N-vinylcarbonamides, N-vinylcaprolactam, etc.; maleimide based monomers such as N-cyclohexylmaleimide, N-isopropylmaleimide, N-laurylmaleimide, N-phenylmalemide, etc.; itaconimide based monomers such as N-methylitaconimide, N-ethylitaconimide, N-butylitaconimide, N-octylitaconimide. N-2-ethylhexylitaconimide, N-cyclohexylitaconimide, N-laurylitaconimide, etc.; succinimide based monomers such as N-(meth)acryloyloxymethylenesuccinimide, N-(meth) acryloyl-6-oxyhexamethylenesuccinimide, N-(meth)acryloyl-8-oxyoctamethylenesuccinimide, etc.; glycol based acrylic ester monomers such as polyethylene glycol (meth)

acrylate, polypropylene glycol (meth)acrylate, methoxyethylene glycol (meth)acrylate, methoxypolypropylene glycol (meth)acrylate, etc.; acrylate based monomers having a hetero ring, a halogen atom, a silicone atom, or the like, such as tetrahydrofurfuryl (meth)acrylate, fluoro(meth)acrylate, silicone (meth)acrylate, etc.; polyfunctional monomers such as hexanediol di(meth)acrylate, (poly)ethylene glycol di(meth)acrylate, (poly)propylene glycol di(meth)acrylate, neopentylglycol di(meth)acrylate, pentaerythritol di(meth)acrylate, trimethylolpropane tri(meth)acrylate, pentaerythritol tri(meth)acrylate, dipentaerythritol hexa(meth)acrylate, epoxy acrylate, polyester acrylate, urethane acrylate, divinylbenzene, butyl di(meth)acrylate, hexyl di(meth)acrylate, etc.; and the like. These copolymerizable monomer components can be used solely or in combination of two or kinds thereof.

In the case of using a radiation-curable pressure-sensitive adhesive (or energy ray-curable pressure-sensitive adhesive) as the pressure-sensitive adhesive, examples of the radiation-curable pressure-sensitive adhesive (composition) include an internal type radiation-curable pressure-sensitive adhesive composed of, as a base polymer, a polymer having a radical reactive carbon-carbon double bond in a polymer side chain, main chain or main chain terminal thereof; a radiation-curable pressure-sensitive adhesive having an ultraviolet ray-curable monomer component or oligomer component blended in a pressure-sensitive adhesive; and the like. In addition, in the case of using a thermally expandable pressure-sensitive adhesive as the pressure-sensitive adhesive, examples of the thermally expandable pressure-sensitive adhesive include a thermally expandable pressure-sensitive adhesive containing a pressure-sensitive adhesive and a foaming agent (especially thermally expandable microspheres); and the like.

In the present invention, the pressure-sensitive adhesive layer 32 may contain various additives (for example, a tackifying resin, a coloring agent, a thickener, an extender, a filler, a plasticizer, an anti-aging agent, an antioxidant, a surfactant, a crosslinking agent, etc.) within the range where the effects of the present invention are not impaired.

The crosslinking agent is not particularly limited, and known crosslinking agents can be used. Specifically, examples of the crosslinking agent include, in addition to isocyanate based crosslinking agents, epoxy based crosslinking agents, melamine based crosslinking agents, and peroxide based crosslinking agents, urea based crosslinking agents, metal alkoxide based crosslinking agents, metal chelate based crosslinking agents, metal salt based crosslinking agents, carbodiimide based crosslinking agents, oxazoline based crosslinking agents, aziridine based crosslinking agents, amine based crosslinking agents, and the like, with isocyanate based crosslinking agents and epoxy based crosslinking agents being suitable. The crosslinking agent can be used solely or in combination of two or more kinds thereof. Incidentally, a use amount of the crosslinking agent is not particularly limited.

Examples of the isocyanate based crosslinking agent include lower aliphatic polyisocyanates such as 1,2-ethylene diisocyanate, 1,4-butylene diisocyanate, 1,6-hexamethylene diisocyanate, etc.; alicyclic polyisocyanates such as cyclopentylene diisocyanate, cyclohexylene diisocyanate, isophorone diisocyanate, hydrogenated tolylene diisocyanate, hydrogenated xylylene diisocyanate, etc.; aromatic polyisocyanates such as 2,4-tolylene diisocyanate, 2,6-tolylene diisocyanate, 4,4'-diphenylmethane diisocyanate, xylylene diisocyanate, etc.; and the like. Besides, a trimethylolpropane/tolylene diisocyanate trimer adduct (a trade name: "COLONATE L" manufactured by Nippon Polyurethane Industry Co., Ltd.), a trimethylolpropane/hexamethylene diisocyanate trimer adduct (a trade name: "COLONATE HL", manufactured by Nippon Polyurethane Industry Co., Ltd.), and the like are also used. In addition, examples of the epoxy based crosslinking agent include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropane polyglycidyl ether, diglycidyl adipate, diglycidyl o-phthalate, triglycidyl-tris(2-hydroxyethyl) isocyanurate, resorcin diglycidyl ether, and bisphenol-S-diglycidyl ether; and besides, epoxy based resins having two or more epoxy groups in a molecule thereof; and the like.

Incidentally, in the present invention, in place of the use of the crosslinking agent or along with the crosslinking agent, it is also possible to apply a crosslinking treatment upon irradiation with electron beams or ultraviolet rays.

The pressure-sensitive adhesive layer 32 can be, for example, formed by utilizing a customary method including mixing a pressure-sensitive adhesive and optional solvent and other additives, followed by forming into a sheet-shaped layer. Specifically, the pressure-sensitive adhesive layer 32 can be, for example, formed by a method of coating a mixture containing a pressure-sensitive adhesive and optional solvent and other additives on the base material 31; a method of coating the foregoing mixture on an appropriate separator (a release paper, etc.) to form the pressure-sensitive adhesive layer 32 and then transferring (transcribing) it onto the base material 31; or the like.

A thickness of the pressure-sensitive adhesive layer 32 is not particularly limited, and for example, it is from about 5 μm to 300 μm (preferably from 5 μm to 200 μm, more preferably from 5 μm to 100 μm, still more preferably from 7 μm to 50 μm). When the thickness of the pressure-sensitive adhesive layer 32 falls within the foregoing range, an appropriate pressure-sensitive adhesive force can be revealed. Incidentally, the pressure-sensitive adhesive layer 32 may be of either a single layer structure or a multilayer structure.

The adhesive force of the pressure-sensitive adhesive layer 32 of the dicing tape 3 to the film 2 for back surface of flip-chip semiconductor (23° C., peeling angle: 180°, peeling rate: 300 mm/min) is preferably in the range of from 0.02 N/20 mm to 10 N/20 mm, and more preferably in the range of from 0.05 N/20 mm to 3 N/20 mm. By regulating the adhesive force to 0.02 N/20 mm or more, at the time of dicing of the semiconductor wafer, the generation of chip flying out can be prevented. On the other hand, by regulating the adhesive force to not more than 10 N/20 mm, at the time of picking-up of the semiconductor element, it is possible to prevent the generation of the matter that peeling of the subject semiconductor element becomes difficult, or that the pressure-sensitive adhesive remains.

Incidentally, is the present invention, the film 2 for back surface of flip-chip semiconductor or the dicing tape-integrated film 1 for back surface of semiconductor can be allowed to have antistatic ability. According to this, the circuit can be prevented from breaking down due to the generation of electrostatic energy at the time of adhesion and at the time of peeling off or the like, or due to charging of a semiconductor wafer or the like by the electrostatic energy. Imparting of the antistatic ability can be performed by an appropriate manner such as a method of adding an antistatic agent or an electrically conductive substance to the base material 31, the pressure-sensitive adhesive layer 32, or the film 2 for back surface of semiconductor, a method of providing an electrically conductive layer composed of a charge transfer complex, a metal film, or the like on the base material 31, etc. As these systems, a system in which an impurity ion having a concern of changing the quality of the semiconductor wafer is difficult to generate is preferable. Examples of the electrically conductive substance (electrically conductive filler) to be blended for the purpose of imparting electrical conductivity, improving thermal conductivity, or the like include a spherical, acicular, or flaky metal powder of sliver, aluminum, gold, copper, nickel, an electrically conductive alloy, or the like; a metal oxide such as alumina, etc.; amorphous carbon black; graphite; and the like. However, the film 2 for back surface of semiconductor is preferably non-electrically conductive from the standpoint of having no electric leakage.

In addition, the film 2 for back surface of flip-chip semiconductor or the dicing tape-integrated film 1 for back surface of semiconductor may be formed in a form where it is wound as a roll or may be formed in a state where the sheet (film) is laminated. For example, in the case where the film has a form in which it is wound as a roll, the film 2 for back surface of semiconductor or a laminate of the film 2 for back surface of semiconductor and the dicing tape 3 is wound as a roll by protecting with a separator according to the need, whereby the film can be fabricated as the film 2 for back surface of semiconductor or the dicing tape-integrated film 1 for back surface of semiconductor in a state or form where it is wound as a roll. Incidentally, the dicing tape-integrated film 1 for back surface of semiconductor in a state or form where it is wound as a roll may be constituted of the base material 31, the pressure-sensitive adhesive layer 32 formed on one surface of the base material 31, the film for back surface of semiconductor formed on the pressure-sensitive adhesive layer 32, and a release-treated layer (rear surface treated layer) formed on the other surface of the base material 31.

Incidentally, a thickness of the dicing tape-integrated film 1 for back surface of semiconductor (total thickness of a thickness of the film for back surface of semiconductor and a thickness of the dicing tape composed of the base material 31 and the pressure-sensitive adhesive layer 32) can be, for example, selected within the range of from 8 μm to 1,500 μm, and the thickness is preferably from 20 μm to 850 μm (more preferably from 31 μm to 500 μm, and especially preferably from 47 μm to 330 μm).

Incidentally, in the dicing tape-integrated film 1 for back surface of semiconductor, by controlling a ratio of the thickness of the film 2 for back surface of semiconductor to the thickness of the pressure-sensitive adhesive layer 32 of the dicing tape 3 or a ratio of the thickness of the film 2 for back surface of semiconductor to the thickness of the dicing tape 3 (total thickness of the base material 31 and the pressure-sensitive adhesive layer 32), dicing properties at the time of a dicing step, picking-up properties at the time of a picking-up step, and the like can be improved, and the dicing tape-integrated film 1 for back surface of semiconductor can be effectively utilized from the dicing step of the semiconductor wafer to the flip-chip bonding step of the semiconductor chip.

(Manufacturing Method of Dicing Tape-integrated Film For Back Surface of Semiconductor)

The manufacturing method of a dicing tape-integrated film for back surface of semiconductor according to the present embodiment is described while referring to the dicing tape-integrated film 1 for back surface of semiconductor shown in FIG. 1 as an example. First of all, the base material 31 can be fabricated by a conventionally known film-forming method.

Examples of the subject film forming method include a calendar film-forming method, a casting method in so organic solvent, an inflation extrusion method in a closed system, a T-die extrusion method, a co-extrusion method, a dry laminating method, and the like.

Subsequently, a pressure-sensitive adhesive composition is coated on the base material 31 and then dried (optionally, further crosslinked under heating) to form the pressure-sensitive adhesive layer 32. Examples of a coating system include roll coating, screen coating, gravure coatings and the like. Incidentally, the pressure-sensitive adhesive composition may be coated directly on the base material 31 to form the pressure-sensitive adhesive layer 32 on the base material 31; or the pressure-sensitive adhesive composition may be coated on a release paper, a surface of which has been subjected to a release treatment, or the like, to form the pressure-sensitive adhesive layer 32, followed by transferring the subject pressure-sensitive adhesive layer 32 onto the base material 31. In this way, the dicing tape 3 having the pressure-sensitive adhesive layer 32 formed on the base material 31 is fabricated.

On the other hand, a forming material for forming the film 2 for back surface of semiconductor is coated on a release paper so as to have a prescribed thickness after drying, and further dried under a prescribed condition (in the case that thermal curing is necessary, or the like, subjected to a heat treatment for drying according to the need), thereby forming a coated layer. This coated layer is transferred onto the pressure-sensitive adhesive layer 32, thereby farming the film 2 for back surface of semiconductor on the pressure-sensitive adhesive layer 32. Incidentally, the film 2 for back surface of semiconductor can also be formed on the pressure-sensitive adhesive layer 32 by coating a forming material for forming the film 2 for back surface of semiconductor directly on the pressure-sensitive adhesive layer 32, followed by drying under a prescribed condition (in the case that thermal curing is necessary, or the like, performing a heat treatment for drying according to the need). According to the above, the dicing tape-integrated film 1 for back surface of semiconductor according to the present invention can be obtained. Incidentally, in the case of performing thermal curing at the time of forming the film 2 for back surface of semiconductor, though it is important to perform the thermal curing to such an extent that the film is in a partially cured state, it is preferable that the thermal curing is not performed.

The dicing tape-integrated film 1 for back surface of semiconductor according to the present invention can be suitably used at the time of manufacturing a semiconductor device including a flip-chip connection step. That is, the dicing tape-integrated film 1 for back surface of semiconductor according to the present invention is used at the time of manufacturing a flip-chip mounted semiconductor device, and thus, the flip-chip mounted semiconductor device is manufactured in a state or form where the film 2 for back surface of semiconductor of the dicing tape-integrated film 1 for back surface of semiconductor is stuck onto the back surface of a semiconductor chip. In consequence, the dicing tape-integrated film 1 for back surface of semiconductor according to the present invention can be used for a flip-chip mounted semiconductor device (a semiconductor device in a state or form where the semiconductor chip is fixed onto an adherend such as a substrate, etc. by a flip-chip bonding system).

Incidentally, similar to the dicing tape-integrated film 1 for back surface of semiconductor, the film 2 for back surface of semiconductor can be used for a flip-chip mounted semiconductor device (a semiconductor device in a state or form where the semiconductor chip is fixed onto an adherend such as a substrate, etc. by a flip-chip bonding system).

(Semiconductor Wafer)

The semiconductor wafer is not particularly limited so far as it is a known or customary semiconductor wafer and can be properly selected and used among semiconductor wafers made of various raw materials. In the present invention, as the semiconductor wafer, a silicon wafer can. be suitably used.

(Manufacturing Method of Semiconductor Device)

The method for manufacturing a semiconductor device according to the present embodiment is hereunder described by referring to FIGS. 2(a) to 2(d). FIGS. 2(a) to 2(d) are each a cross-sectional schematic view showing a method for manufacturing a semiconductor device in the case where the dicing tape-integrated film 1 for back surface of semiconductor is used.

According to the manufacturing method of a semiconductor device as described above, a semiconductor device can be manufactured using the dicing tape-integrated film 1 for back surface of semiconductor. Specifically, the method includes at least a step of sticking a semiconductor wafer onto the dicing tape-integrated film for back surface of semiconductor; a step of dicing the semiconductor wafer; a step of picking up a semiconductor element obtained by dicing; and a step of flip-chip connecting the semiconductor element onto an adherend.

Incidentally, in the case of the film 2 for back surface of semiconductor, a semiconductor device can be manufactured in conformity with the manufacturing method of a semiconductor device in the case where the dicing tape-integrated film 1 for back surface of semiconductor is used. For example, a semiconductor device can be manufactured by sticking the film 2 for back surface of semiconductor to a dicing tape and using it as a dicing tape-integrated film for back surface of semiconductor in which the film is integrated with the dicing tape. In that case, the manufacturing method of a semiconductor device using the film 2 for back surface of semiconductor is a manufacturing method including, in addition to the steps in the foregoing manufacturing method of a dicing tape-integrated film for back surface of semiconductor, a step of sticking the film for back surface of semiconductor and the dicing tape to each other in a form where the film for back surface of semiconductor and a pressure-sensitive adhesive layer of the dicing tape come into contact with each other.

In addition, the film 2 for back surface of semiconductor can also be stuck onto the semiconductor wafer without being integrated with the dicing tape. In that case, the manufacturing method of a semiconductor device using the film 2 for back surface of semiconductor is a manufacturing method in which the step of sticking a semiconductor wafer onto the dicing tape-integrated film for back surface of semiconductor in the foregoing manufacturing method of a dicing tape-integrated film for back surface of semiconductor is replaced by a step of sticking a film for back surface of semiconductor onto a semiconductor wafer and a step of sticking a dicing tape onto the film for back surface of semiconductor stuck onto the semiconductor wafer in a form where the film for back surface of semiconductor and a pressure-sensitive adhesive layer of the dicing tape come into contact with each other.

In addition, as for the film 2 for back surface of semiconductor, the semiconductor wafer can be used upon being stuck onto an individualized semiconductor chip. In that case, the manufacturing method of a semiconductor device using the film 2 for back surface of semiconductor may be, for example, a manufacturing method including at least a step of sticking a dicing tape onto a semiconductor wafer; a step of dicing the semiconductor wafer; a step of picking up a semiconductor element obtained by dicing; a step of flip-chip connecting the semiconductor element onto an adherend; and a step of sticking a film for back surface of semiconductor element onto the semiconductor element.

[Mounting Step]

Figure 2:
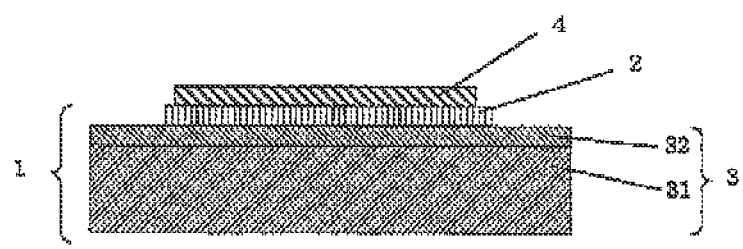
FIGS. 2(a) to 2(d) are cross-sectional schematic views showing an example of a method for manufacturing a semiconductor device using a dicing tape-integrated film for back surface of semiconductor according to the present invention.
Figure 2:
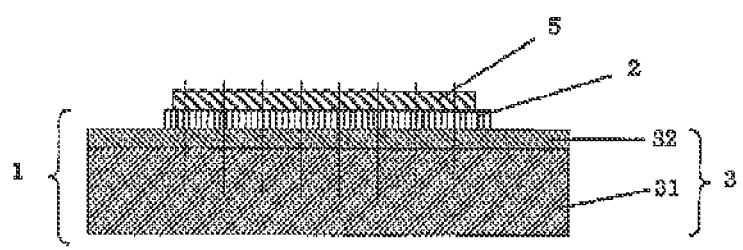
Figure 2:
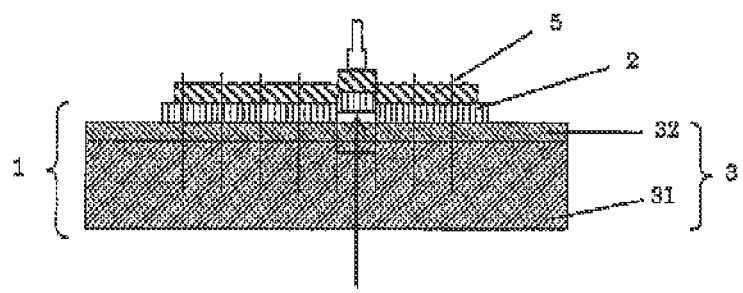
Figure 2:
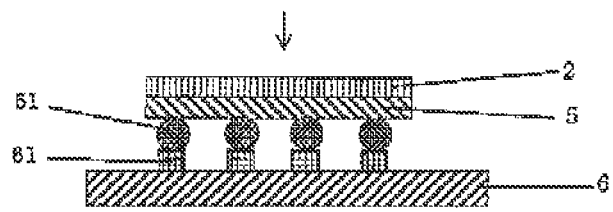

First of all, as shown in FIG. 2(a), a separator arbitrarily provided on the film 2 for back surface of semiconductor of the dicing tape-integrated film 1 for back surface of semiconductor is properly peeled off, and the semiconductor wafer 4 is stuck onto the subject film 2 for back surface of semiconductor, followed by fixing this by adhesion and holding (mounting step). At that time, the film 2 for back surface of semiconductor is in an uncured state (including a semi-cured state). In addition, the dicing tape-integrated film 1 for back surface of semiconductor is stuck onto the back surface of the semiconductor wafer 4. The back surface of the semiconductor wafer 4 as referred herein means a face on the opposite side to the circuit face (also referred to as a non-circuit face, a non-electrode formed face, etc.). Though a sticking method is not particularly limited, a method by press bonding is preferable. The press bonding is usually performed while pressing with pressing means such as a pressing roll, etc.

[Dicing Step]

Subsequently, as shown in FIG. 2(b), the semiconductor wafer 4 is diced. According to this, the semiconductor wafer 4 is cut into a prescribed size and individualized (formed into small pieces) to manufacture a semiconductor chip 5. The dicing is, for example, performed in the usual way from the circuit face side of the semiconductor wafer 4. In addition, in the present step, for example, a cutting system called full cutting that forms a slit reaching the dicing tape-integrated film 1 for back surface of semiconductor, or the like can be adopted. A dicing apparatus which is used in the present step is not particularly limited, and a conventionally known apparatus can be used. In addition, since the semiconductor wafer 4 is adhered and fixed with excellent adhesion by the dicing tape-integrated film 1 for back surface of semiconductor having the film for back surface of semiconductor, not only chip cracking and chip flying can be suppressed, but damaging of the semiconductor wafer 4 can be suppressed. Incidentally, when the film 2 for back surface of semiconductor is formed of a resin composition containing an epoxy resin, even if the film is cut by dicing, the generation of adhesive extrusion from the adhesive layer of the film for back surface of semiconductor can be suppressed or prevented at a cut surface thereof. As a result, re-attachment (blocking) of the cut surfaces to each other can be suppressed or prevented, and thus, the picking-up as described later can be more favorably performed.

Incidentally, in the case where the dicing tape-integrated film 1 for back surface of semiconductor is expanded, the expansion can be performed using a conventionally known expanding apparatus. The expanding apparatus has a doughnut-shaped outer ring capable of pushing the dicing tape-integrated film 1 for back surface of semiconductor downward via a dicing ring; and an inner ring which has a diameter smaller than the outer ring and supports the dicing tape-integrated film for back surface of semiconductor. Owing to this expanding step, it is possible to prevent damaging of adjacent semiconductor chips to each other in a picking-up step as described later.

[Picking-up Step]

In order to collect the semiconductor chips 5 adhered and fixed onto the dicing tape-integrated film 1 for back surface of semiconductor, picking-up of the semiconductor chip 5 is performed as shown in FIG. 2(c), thereby peeling off the semiconductor chip 5 together with the film 2 for back surface of semiconductor from the dicing tape 3. The method of picking-up is not particularly limited, and conventionally known various methods can be adopted. For example, there are exemplified a method of pushing up the individual semiconductor chip 5 from the side of the base material 31 of the dicing tape-integrated film 1 for back surface of semiconductor with a needle and picking up the semiconductor chip 5 pushed up with a picking-up apparatus; and the like. Incidentally, the back surface of the picked-up semiconductor chip 5 is protected by the film 2 for back surface of semiconductor.

[Flip-chip Connecting Step]

As shown in FIG. 2(d), the picked-up semiconductor chip 5 is fixed onto an adherend such as a substrate, etc. by a flip-chip bonding system (flip-chip mounting system). Specifically, the semiconductor chip 5 is fixed onto the adherend 6 in the usual way in such a manner that the circuit face of the semiconductor chip 5 (also referred to as a surface, a circuit pattern formed face, a non-electrode formed face, or the like) opposes to the adherend 6. For example, by melting an electrically conductive material (a solder, etc.) 61 for joining as adhered onto a connecting pad of the adherend 6 while pressing a bump 51 formed on the circuit face side of the semiconductor chip 5 against the electrically conductive material upon being brought into contact with each other, an electrical connection between the semiconductor chip 5 and the adherend 6 is secured, whereby the semiconductor chip 5 can be fixed onto the adherend 6 (flip-chip bonding step). At that time, a gap is formed between the semiconductor chip 5 and the adherend 6, and a gap distance thereof is generally from about 30 μm to 300 μm. Incidentally, after the semiconductor chip 5 has been flip-chip bonded (flip-chip connected) onto the adherend 6, it is important to wash an opposing surface between the semiconductor chip 5 and the adherend 6 or a gap therebetween and fill an encapsulating material (an encapsulating resin, etc.) in the subject gap, thereby achieving encapsulation.

As the adherend 6, various substrates such as lead frames, circuit boards (wiring circuit boards, etc.), etc. can be used. Though a material of such a substrate is not particularly limited, examples thereof include ceramic substrates and plastic substrates. Examples of the plastic substrate include epoxy substrates, bismaleimide triazine substrates, polyimide substrates, and the like.

In the flip-chip bonding step, a material of the bump or the electrically conductive material is not particularly limited. Examples thereof include solders (alloys) such as tin-lead based metal materials, tin-silver based metal materials, tin-silver-copper based metal materials, tin-zinc based metal materials, tin-zinc-bismuth based metal materials, etc.; and gold based metal materials; copper based metal materials; and the like.

Incidentally, in the flip-chip bonding step, the electrically conductive material is melted to connect the bump on the circuit face side of the semiconductor chip 5 and the electrically conductive material on the surface of the adherend 6 to each other. A temperature at the time of melting of this electrically conductive material is usually about 260° C. (for example, from 250° C. to 300° C.). The dicing tape-integrated film for back surface of semiconductor according to the present invention can be allowed to have heat resistance such that it is capable of enduring high temperatures in this flip-chip bonding step by forming the film for back surface of semiconductor by an epoxy resin or the like.

In the present step, it is preferable to wash an opposing face (electrode-formed face) between the semiconductor chip 5 and the adherend 6 or a gap therebetween. A washing liquid to be used for the subject washing is not particularly limited, and examples thereof include organic washing liquids and aqueous washing liquids. The film for back surface of semiconductor in the dicing tape-integrated film for back surface of semiconductor according to the present invention has solvent resistance against the washing liquids and does not substantially have solubility in these washing liquids. Therefore, as described above, various washing liquids can be used as the washing liquid, and the washing can be achieved by a conventional method without requiring a special washing liquid.

Subsequently, an encapsulation step is performed for encapsulating the gap between the flip-chip bonded semiconductor chip 5 and the adherend 6. The encapsulation step is performed using an encapsulating resin. At that time, though the encapsulation condition is not particularly limited, the thermal curing of the encapsulating resin is usually carried out upon heating at 175° C. for from 60 seconds to 90 seconds. However, it should not be construed that the present invention is limited thereto, and for example, the curing can be performed at from 165 to 185° C. for a few minutes. In the heat treatment in the subject step, not only the thermal curing of the encapsulating resin but the thermal curing of the film 2 for back surface of semiconductor is carried out at the same time. According to this, both the encapsulating resin and the film 2 for back surface of semiconductor cause cure shrinkage with the progress of thermal curing. As a result, a stress due to cure shrinkage of the encapsulating resin, which is applied to the semiconductor chip 5, can be cancelled or relieved due to cure shrinkage of the film 2 for back surface of semiconductor. In addition, according to the subject step, the film 2 for back surface of semiconductor can be completely or substantially completely thermally cured and can be stuck onto the back surface of a semiconductor element with excellent adhesion. Furthermore, the film 2 for back surface of semiconductor according to the present invention can be thermally cured together with the encapsulating material at the time of the encapsulation step even if the film is in an uncured state, so that it is not necessary to newly add a step of thermally curing the film 2 for back surface of semiconductor.

The encapsulating resin is not particularly limited so far as it is a resin having insulating properties (an insulating resin). Though the encapsulating resin can be properly selected and used among known encapsulating materials such as encapsulating resins, etc., it is more preferably an insulating resin having elasticity. Examples of the encapsulating resin include resin compositions containing an epoxy resin; and the like. Examples of the epoxy resin include the epoxy resins as exemplified above; and the like. In addition, the encapsulating resin composed of a resin composition containing an epoxy resin may contain, in addition to an epoxy resin, a thermosetting resin other than the epoxy resin (a phenol resin, etc.), or a thermoplastic resin as a resin component. Incidentally, the phenol resin can also be utilized as a curing agent of the epoxy resin, and examples of such a phenol resin include the phenol resins as exemplified above; and the like.

According to the semiconductor device (flip-chip mounted semiconductor device) manufactured using the dicing tape-integrated film 1 for back surface of semiconductor or the film 2 for bask surface semiconductor, the film for back surface of semiconductor is stuck onto the back surface of the semiconductor chip, and therefore, marking of every kind can be applied with excellent visibility. In particular, even if the marking method is a laser marking method, marking can be applied with an excellent contrast ratio, and information of every kind (literal information, graphical information, etc.) applied by laser marking can be observed with good visibility. Incidentally, at the time of performing laser marking, a known laser marking apparatus can be utilized. In addition, as the laser, various lasers such as a gas laser, a solid laser, a liquid laser, etc. can be utilized. Specifically, the gas laser is not particularly limited, and known gas lasers can be utilized. Of these, a carbon oxide laser ($CO_2$ laser) and an excimer laser (ArF laser, KrF laser, XeCl laser, XeF laser, etc.) are suitable. In addition, the solid laser is not particularly limited, and known solid lasers can be utilized. Of these, a YAG laser (Nd:YAG laser, etc.) and a $YVO_4$ laser are suitable.

Since the semiconductor device manufactured using the dicing tape-integrated film for back surface of semiconductor or the film for back surface of semiconductor according to the present invention is a semiconductor device mounted by the flip-chip mounting system, the device has a thinned and miniaturized shape as compared with a semiconductor device mounted by the die bonding mounting system. Therefore, the semiconductor devices can be suitably used as various electronic instruments or electronic parts or materials or members thereof. Specifically, examples of the electronic instrument in which the flip-chip mounted semiconductor devices according to the present invention are utilized include so-called "mobile phones" and "PHS", small-sized computers [for example, so-called "PDA" (personal digital assistant), so-called "laptop personal computer", so-called "Net Book (trademark)", so-called "wearable computers", etc.], small-sized electronic instruments having a "mobile phone" and a computer integrated with each other, so-called "Digital Camera (trademark)", so-called "digital video cameras", small-sized television sets, small-sized game machines, small-sized digital audio players, so-called "electronic notepads", so-called "electronic dictionaries", electronic device terminals for so-called "electronic books", mobile electronic instruments (portable electronic devices) such as small-sized digital type watches, etc., and the like. As a matter of course, electronic instruments (stationary type ones, etc.) other than mobile ones (for example, so-called "desktop personal computers", thin type television sets, electronic instruments for recording and reproduction (hard disk recorders, DVD players, etc.), projectors, micromachines, and the like) may also be mentioned. In addition, electronic parts, or materials or members of electronic instruments or electronic parts, are not particularly limited, and examples thereof include parts for so-called "CPU" and members for various storage devices (so-called "memories", hard disks, etc).

EXAMPLES

The present invention is hereunder described in detail by reference to the following Examples. However, it should be construed that the present invention is not limited to the following Examples so far as the gist thereof is not deviated. In addition, all parts in each of the Examples are made on a weight basis unless otherwise indicated.

Example 1

<Fabrication of Film For Back Surface of Flip-chip Semiconductor>

117 parts of an epoxy resin (a trade name: "EPIKOTE 1004", manufactured by JER Co., Ltd.), 117 parts of a phenol resin (a trade name; "MIREX XLC-4L", manufactured by Mitsui Chemicals, Inc.), 83 parts of spherical silica (a trade name: "SO-25R", manufactured by Admatechs Company Limited), 4 parts of a dye (a trade name: "OIL BLACK BS" manufactured by Orient Chemical Industries Co., Ltd.), and 1.7 parts of a curing-accelerating catalyst (a trade name: "2PHZ-PW", manufactured by Shikoku Chemicals Corporation) based on 100 parts of an acrylic acid ester based polymer composed mainly of ethyl acrylate and methyl methacrylate (a trade name: "PARACRON W-197CM", manufactured by Negami Chemical Industrial Co., Ltd.) were dissolved in methyl ethyl ketone to prepare a solution of an adhesive composition having a solid content concentration of 23.6% by weight.

This solution of the adhesive composition was applied on, as a release liner (separator), a 50 μm-thick release-treated film composed of a polyethylene terephthalate film, which had been subjected to a silicone release treatment, and then dried at 130° C. for 2 minutes to prepare a film A for back surface of flip-chip semiconductor having a thickness (average thickness) of 30 μm.

<Fabrication of Dicing Tape-integrated Film For Back Surface of Semiconductor>

The foregoing film A for back surface of flip-chip semiconductor was stuck onto a pressure-sensitive adhesive layer of a dicing tape (a trade name: "V-8-T", manufactured by Nitto Denko Corporation, average thickness of base material: 65 μm, average thickness of pressure-sensitive adhesive layer: 10 μm) using a hand roller, thereby fabricating a dicing tape-integrated film for back surface of semiconductor.

Example 2

<Fabrication of Film For Back Surface of Flip-chip Semiconductor>

200 parts of an epoxy resin (a trade name: "EPIKOTE 1004", manufactured by JER Co., Ltd.), 200 parts of a phenol resin (a trade name: "MIREX XLC-4L", manufactured by Mitsui Chemicals, Inc.), 125 parts of spherical silica (a trade name: "SO-25R", manufactured by Admatechs Company Limited), 4 parts of a dye (a trade name: "OIL GREEN 502", manufactured by Orient Chemical Industries Co., Ltd.), and 5 parts of a curing-accelerating catalyst (a trade name: "2PHZ-PW", manufactured by Shikoku Chemicals Corporation) based on 100 parts of an acrylic acid ester based polymer composed mainly of ethyl acrylate and methyl methacrylate (a trade name: "PARACRON W-197CM", manufactured by Negami Chemical Industrial Co., Ltd.) were dissolved in methyl ethyl ketone to prepare a solution of an adhesive composition having a solid content concentration of 23.6% by weight.

This solution of the adhesive composition was applied on, as a release liner (separator), a 50 μm-thick release-treated film composed of a polyethylene terephthalate film, which had been subjected to a silicone release treatment, and then dried at 130° C. for 2 minutes to prepare a film B for back surface of flip-chip semiconductor having a thickness (average thickness) of 30 μm.

<Fabrication of Dicing Tape-integrated Film For Back Surface of Semiconductor>

The foregoing film B for back surface of flip-chip semiconductor was stuck onto a pressure-sensitive adhesive layer of a dicing tape (a trade name: "V-8-T", manufactured by Nitto Denko Corporation, average thickness of base material: 65 μm, average thickness of pressure-sensitive adhesive layer: 10 μm) using a hand roller, thereby fabricating a dicing tape-integrated film, for back surface of semiconductor.

(Amount of Thermal Curing Shrinkage)

A polyethylene terephthalate film (thickness: 38 μm) was stuck onto one surface of the film for back surface of flip-chip semiconductor fabricated in each of the Examples. A volume was measured with a ruler in this state. Subsequently, after heating under a condition at 165° C. for 2 hours, the film for back surface of flip-chip semiconductor was peeled off from the polyethylene terephthalate film, and a volume was measured with a ruler. Then, an amount of shrinkage (% by volume) after thermal curing relative to the whole volume before thermal curing was determined. The results are shown in the following Table 1.

(Warp Amount of Semiconductor Package)

The presence or absence of the generation of a warp of the semiconductor chip was evaluated by measuring a warp amount of the semiconductor chip.

That is, first of all, after peeling off the separator from the dicing tape-integrated film for back surface of semiconductor, a semiconductor wafer (diameter: 8 inches, thickness: 200 μm; a silicon mirror wafer) was stuck onto the film for back surface of semiconductor by means of roll press bonding at 70° C. Furthermore, dicing of the semiconductor wafer was performed. The dicing was performed as full cutting so as to have a chip size of 10 mm square. Incidentally, a sticking condition and a dicing condition are as follows.

[Sticking Condition]

Sticking apparatus: A trade name: "MA-3000III", manufactured by Nitto Seiki Co., Ltd.
  Sticking speed: 10 mm/min
  Sticking pressure: 0.15 MPa
  Stage temperature at the time of sticking: 70° C.

[Dicing Condition]

Dicing apparatus: A trade name: "DFD-6361", manufactured by DISCO Corporation
  Dicing ring: "2-8-1" (manufactured by DISCO Corporation)
  Dicing speed: 30 mm/sec
  Dicing blade:
    Z1: "203O-SE 27HCDD", manufactured by DISCO Corporation
    Z2: "203O-SE 27HCBB", manufactured by DISCO Corporation
  Dicing blade rotation number:
    Z1: 40,000 r/min
    Z2: 45,000 r/min
  Cutting system: Step cutting
  Wafer chip size: 10.0 mm square Subsequently, the semiconductor chip obtained by dicing was picked up from the pressure-sensitive adhesive layer together with the film for back surface of flip-chip semiconductor by pushing up from the dicing tape side of the dicing tape-integrated film for back surface of semiconductor with a needle. A picking-up condition is as follows.

[Picking-up Condition]

Picking-up apparatus: A trade name: "SPA-300", manufactured by Shinkawa Co., Ltd.
  Number of picking-up needles: 9 needles
  Pushing-up speed of needle: 20 mm/s
  Pushing-up distance of needle: 500 μm
  Picking-up time: 1 second
  Dicing tape expanding amount: 3 mm Subsequently, the semiconductor chip was flip-chip bonded onto a BT substrate [BT RESIN (bismaleimide triazine based resin), manufactured by Mitsubishi Gas Chemical Company, Inc.]. At that time, the circuit face of the semiconductor chip was made opposite to the BT substrate, thereby bringing the bump formed on the circuit face of the semiconductor chip into contact with an electrically conductive material for (solder) for joining as adhered onto a connecting pad of the BT substrate, and the temperature was elevated to 260° C. while pressing, to melt the electrically conductive material, followed by cooling to room temperature. Furthermore, an underfill material as an encapsulating resin was injected into a gap between the semiconductor chip and the BT substrate. At that time, a thickness of the underfill (encapsulating material) was 20 μm. Subsequently, the semiconductor package was heated under a condition at 165° C. for 2 hours and then measured for a warp amount thereof.

As for the measurement of the warp amount, first of all, the semiconductor package was placed on a flat plate such that the BT substrate was faced downward, and a height of the BT substrate lifting up from the flat plate, namely a warp amount (μm) was measured. The measurement was carried out under a condition at a measuring speed of 1.5 mm/s and a load of 1 g by using a contact type surface roughness tester (DEK-TAK8, manufactured by Veeco Instruments Inc.). As a result of the measurement, the case where the warp amount was not more than 100 μm is evaluated as "o", and the case where the warp amount exceeded 100 μm is evaluated as "x". The results are shown in the following Table 1.

TABLE 1

| | Amount of thermal curing shrinkage (% by volume) | Thickness of film for back surface of semiconductor (μm) | Warp amount of semiconductor element |
|---|---|---|---|
| Example 1 | 2.1 | 30 | o |
| Example 2 | 3.9 | 30 | o |

(Results)

As is noted from Table 1, it was confirmed that as shown in Examples 1 and 2, in the films for back surface of semiconductor having an amount of thermal curing shrinkage of 2% by volume or more, all of the warp amounts of the semiconductor packages could be suppressed to nor more than 100 μm.

Example 3

<Fabrication of Film For Back Surface of Flip-chip Semiconductor>

68 parts of an epoxy resin (a trade name: "EPIKOTE 1004", manufactured by JER Co., Ltd.), 68 parts of a phenol resin (a trade name: "MIREX XLC-4L", manufactured by Mitsui Chemicals, Inc.), 83 parts of spherical silica (a trade name: "SO-25R", manufactured by Admatechs Company Limited), 4 parts of a dye (a trade name: "OIL BLACK BS", manufactured by Orient Chemical Industries Co., Ltd.), and 1.7 parts of a curing-accelerating catalyst (a trade name: "2PHZ-PW", manufactured by Shikoku Chemicals Corporation) based on 100 parts of an acrylic acid ester based polymer composed mainly of ethyl acrylate and methyl methacrylate (a trade name: "PARACRON W-197CM", manufactured by Negami Chemical Industrial Co., Ltd.) were dissolved in methyl ethyl ketone to prepare a solution of an adhesive composition having a solid content concentration of 23.6% by weight.

This solution of the adhesive composition was applied on, as a release liner (separator), a 50 μm-thick release-treated film composed of a polyethylene terephthalate film, which had been subjected to a silicone release treatment, and then dried at 130° C. for 2 minutes to prepare a film C for back surface of flip-chip semiconductor having a thickness (average thickness) of 30 μm.

<Fabrication of Dicing Tape-integrated Film For Back Surface of Semiconductor>

The foregoing film C for back surface of flip-chip semiconductor was stuck onto a pressure-sensitive adhesive layer of a dicing tape (a toads name: "V-8-T", manufactured by Nitto Denko Corporation, average thickness of base material: 65 μm, average thickness of pressure-sensitive adhesive layer: 10 µm) using a hand roller, thereby fabricating a dicing tape-integrated film for back surface of semiconductor.

Example 4

<Fabrication of Film For Back Surface of Flip-chip Semiconductor>

98 parts of an epoxy resin (a trade name: "EPIKOTE 1004", manufactured by JER Co., Ltd.), 98 parts of a phenol resin (a trade name: "MIREX XLC-4L", manufactured by Mitsui Chemicals, Inc.), 125 parts of spherical silica (a trade name: "SO-25R", manufactured by Admatechs Company Limited), 4 parts of a dye (a trade name: "OIL BLACK BS", manufactured by Orient Chemical Industries Co., Ltd.), and 1.7 parts of a curing-accelerating catalyst (a trade name: "2PHZ-PW", manufactured by Shikoku Chemicals Corporation) based on 100 parts of an acrylic acid ester based polymer composed mainly of ethyl acrylate and methyl methacrylate (a trade name: "PARACRON W-197CM", manufactured by Negami Chemical Industrial Co., Ltd.) were dissolved in methyl ethyl ketone to prepare a solution of an adhesive composition having a solid content concentration of 23.6% by weight.

This solution of the adhesive composition was applied on, as a release liner (separator), a 50 µm-thick release-treated film composed of a polyethylene terephthalate film, which had been subjected to a silicone release treatment, and then dried at 130° C. for 2 minutes to prepare a film D for back surface of flip-chip semiconductor having a thickness (average thickness) of 30 µm.

<Fabrication of Dicing Tape-integrated Film For Back Surface of Semiconductor>

The foregoing film D for back surface of flip-chip semiconductor was stuck onto a pressure-sensitive adhesive layer of a dicing tape (a trade name: "V-8-T", manufactured by Nitto Denko Corporation, average thickness of base material: 65 µm, average thickness of pressure-sensitive adhesive layer: 10 µm) using a hand roller, thereby fabricating a dicing tape-integrated film for back surface of semiconductor.

Comparative Example 1

<Fabrication of Film For Back Surface of Flip-chip Semiconductor>

29 parts of an epoxy resin (a trade name: "EPIKOTE 1004", manufactured by JER Co., Ltd.), 29 parts of a phenol resin (a trade name: "MIREX XLC-4L", manufactured by Mitsui Chemicals, Inc.), 185 parts of spherical silica (a trade name: "SO-25R", manufactured by Admatechs Company Limited), 4 parts of a dye (a trade name; "OIL BLACK BS", manufactured by Orient Chemical Industries Co., Ltd.), and 1.7 parts of a curing-accelerating catalyst (a trade name: "2PHZ-PW", manufactured by Shikoku Chemicals Corporation) based on 100 parts of an acrylic acid ester based polymer composed mainly of ethyl acrylate and methyl methacrylate (a trade name: "PARACRON W-197CM", manufactured by Negami Chemical Industrial Co., Ltd.) were dissolved in methyl ethyl ketone to prepare a solution of an adhesive composition having a solid content concentration of 23.6% by weight.

This solution of the adhesive composition was applied on, as a release liner (separator), a 50 µm-thick release-treated film composed of a polyethylene terephthalate film, which had been subjected to a silicone release treatment, and then dried at 130° C. for 2 minutes to prepare a film E for back surface of flip-chip semiconductor having a thickness (average thickness) of 30 µm.

<Fabrication of Dicing Tape-integrated Film For Back Surface of Semiconductor>

The foregoing film E for back surface of flip-chip semiconductor was stuck onto a pressure-sensitive adhesive layer of a dicing tape (a trade name: "V-8-T", manufactured by Nitto Denko Corporation, average thickness of base material: 65 µm, average thickness of pressure-sensitive adhesive layer: 10 µm) using a hand roller, thereby fabricating a dicing tape-integrated film for back surface of semiconductor.

(Amount of Thermal Curing Shrinkage)

A polyethylene terephthalate film (thickness: 38 µm) was stuck onto one surface of the film for back surface of flip-chip semiconductor fabricated in each of the Examples and Comparative Example. A volume was measured with a ruler in this state. Subsequently, after hearing under a condition at 165° C. for 2 hours, the film for back surface of flip-chip semiconductor was peeled off from the polyethylene terephthalate film, and a volume was measured with a ruler. Then, an amount of shrinkage (% by volume) after thermal curing relative to the whole volume before thermal curing was determined. The results are shown in the following Table 2.

(Warp Amount of Semiconductor Package)

The presence or absence of the generation of a warp of the semiconductor chip was evaluated by measuring a warp amount of the semiconductor chip.

That is, first of all, after peeling off the separator from the dicing tape-integrated film for back surface of semiconductor, a semiconductor wafer (diameter; 8 inches, thickness: 200 µm; a silicon mirror wafer) was stuck onto the film for back surface of semiconductor by means of roll press bonding at 70° C. Furthermore, dicing of the semiconductor wafer was performed. The dicing was performed as full cutting so as to have a chip size of 10 mm square. Incidentally, a sticking condition and a dicing condition are as follows.

[Sticking Condition]

Sticking apparatus: A trade name: "MA-3000III", manufactured by Nitto Seiki Co., Ltd.
Sticking speed: 10 mm/min
Sticking pressure: 0.15 MPa
Stage temperature at the time of sticking: 70° C.

[Dicing Condition]

Dicing apparatus: A trade name: "DFD-6361", manufactured by DISCO Corporation
Dicing ring: "2-8-1" (manufactured by DISCO Corporation)
Dicing speed: 30 mm/sec
Dicing blade:
Z1: "203O-SE 27HCDD", manufactured by DISCO Corporation
Z2: "203O-SE 27HCBB", manufactured by DISCO Corporation
Dicing blade rotation number:
Z1: 40,000 r/min
Z2: 45,000 r/min
Cutting system: Step cutting
Wafer chip size: 10.0 mm square Subsequently, the semiconductor chip obtained by dicing was picked up from the pressure-sensitive adhesive layer together with the film for back surface of flip-chip semiconductor by pushing up from the dicing tape side of the dicing tape-integrated film for back surface of semiconductor with a needle. A picking-up condition is as follows.

[Picking-Up Condition]

Picking-up apparatus: A trade name: "SPA-300", manufactured by Shinkawa Co., Ltd.
Number of picking-up needles: 9 needles
Pushing-up speed of needle: 20 mm/s Pushing-up distance of needle: 500 μm
Picking-up time: 1 second
Dicing tape expanding amount: 3 mm Subsequently, the semiconductor chip was flip-chip bonded onto a BT substrate [BT RESIN (bismaleimide triazine based resin), manufactured by Mitsubishi Gas Chemical Company, Inc.]. At that time, the circuit face of the semiconductor chip was made opposite to the BT substrate, thereby bringing the bump formed on the circuit face of the semiconductor chip into contact with an electrically conductive material for (solder) for joining as adhered onto a connecting pad of the BT substrate, and the temperature was elevated to 260° C. while pressing, to melt the electrically conductive material, followed by cooling to room temperature. Furthermore, an underfill material as an encapsulating resin was injected into a gap between the semiconductor chip and the BT substrate. At that time, a thickness of the underfill (encapsulating material) was 20 μm. Subsequently, the semiconductor package was heated under a condition at 165° C. for 2 hours and then measured for a warp amount thereof.

As for the measurement of the warp amount, first of all, the semiconductor package was placed on a flat plate such that the BT substrate was faced downward, and a height of the BT substrate lifting up from the flat plate, namely a warp amount (μm) was measured. The measurement was carried out under a condition at a measuring speed of 1.5 mm/s and a load of 1 g by using a contact type surface roughness tester (DEKTAK8, manufactured by Veeco Instruments Inc.). As a result of the measurement, the case where the warp amount was not more than 100 μm is evaluated as "o" and the case where the warp amount exceeded 100 μm is evaluated as "x". The results are shown in the following Table 2.

TABLE 2

| | Content of thermosetting resin (% by weight) | Amount of thermal curing shrinkage (% by volume) | Thickness of film for back surface of semiconductor (μm) | Warp amount of semiconductor element |
|---|---|---|---|---|
| Example 3 | 58 | 2.1 | 30 | o |
| Example 4 | 66 | 2.1 | 30 | o |
| Comparative Example 1 | 37 | 0.4 | 30 | x |

(Results)

As is noted from Table 2, it was confirmed that as shown in Examples 3 and 4, in the films for back surface of semiconductor in which the content of the thermosetting resin was 40% by weight or more relative to all of the resin components, all of the warp amounts of the semiconductor packages could be suppressed to not more than 100 μm. On the other hand, as shown in Comparative Example 2, in the film for back surface of semiconductor in which the foregoing content of the thermosetting resin was 37% by weight, the warp amount of the semiconductor package could not be reduced to not more than 100 μm.

Example 5

<Fabrication of Film For Back Surface of Flip-chip Semiconductor>

75 parts of an epoxy resin (a trade name: "EPIKOTE 1004", manufactured by JER Co., Ltd.), 75 parts of a phenol resin (a trade name: "MIREX XLC-4L", manufactured by Mitsui Chemicals, Inc.), 185 parts of spherical silica (a trade name: "SO-25R", manufactured by Admatechs Company Limited), 4 parts of a dye (a trade name: "OIL BLACK BS", manufactured by Orient Chemical Industries Co., Ltd.), and 3.0 parts of a curing-accelerating catalyst (a trade name: "2PHZ-PW", manufactured by Shikoku Chemicals Corporation) based on 100 parts of an acrylic acid ester based polymer composed mainly of ethyl acrylate and methyl methacrylate (a trade name: "PARACRON W-197CM", manufactured by Negami Chemical Industrial Co., Ltd.) were dissolved in methyl ethyl ketone to prepare a solution of an adhesive composition having a solid content concentration of 23.6% by weight.

This solution of the adhesive composition was applied on, as a release liner (separator), a 50 μm-thick release-treated film composed of a polyethylene terephthalate film, which had been subjected to a silicone release treatment, and then dried at 130° C. for 2 minutes to prepare a film F for back surface of flip-chip semiconductor having a thickness (average thickness) of 30 μm.

<Fabrication of Dicing Tape-Integrated Film For Back Surface of Semiconductor>

The foregoing film F for back surface of flip-chip semiconductor was stuck onto a pressure-sensitive adhesive layer of a dicing tape (a trade name: "V-8-T", manufactured by Nitto Denko Corporation, average thickness of base material: 65 μm, average thickness of pressure-sensitive adhesive layer: 10 μm) using a hand roller, thereby fabricating a dicing tape-integrated film for back surface of semiconductor.

Example 6

<Fabrication of Film For Back Surface of Flip-chip Semiconductor>

75 parts of an epoxy resin (a trade name: "EPIKOTE 1004", manufactured by JER Co., Ltd.), 75 parts of a phenol resin (a trade name: "MIREX XLC-4L", manufactured by Mitsui Chemicals, Inc.), 185 parts of spherical silica (a trade name: "SO-25R", manufactured by Admatechs Company Limited), 4 parts of a dye (a trade name: "OIL BLACK BS", manufactured by Orient Chemical Industries Co., Ltd.), and 2.3 parts of a curing-accelerating catalyst (a trade name: "2PHZ-PW", manufactured by Shikoku Chemicals Corporation) based on 100 parts of an acrylic acid ester based polymer composed mainly of ethyl acrylate and methyl methacrylate (a trade name: "PARACRON W-197CM", manufactured by Negami Chemical Industrial Co., Ltd.) were dissolved in methyl ethyl ketone to prepare a solution of an adhesive composition having a solid content concentration of 23.6% by weight.

This solution of the adhesive composition was applied on, as a release liner (separator), a 50 μm-thick release-treated film composed of a polyethylene terephthalate film, which had been subjected to a silicone release treatment, and then dried at 130° C. for 2 minutes to prepare a film G for back surface of flip-chip semiconductor having a thickness (average thickness) of 30 μm.

<Fabrication of Dicing Tape-integrated Film For Back Surface of Semiconductor>

The foregoing film G for back surface of flip-chip semiconductor was stuck onto a pressure-sensitive adhesive layer of a dicing tape (a trade name: "V-8-T", manufactured by Nitto Denko Corporation, average thickness of base material: 65 μm, average thickness of pressure-sensitive adhesive layer: 10 μm) using a hand roller, thereby fabricating a dicing tape-integrated film for back surface of semiconductor.

(Amount of Thermal Curing Shrinkage)

A polyethylene terephthalate film (thickness: 38 μm) was stuck onto one surface of the film for back surface of flip-chip semiconductor fabricated in each of the Examples. A volume was measured with a ruler in this state. Subsequently, after heating under a condition at 165° C. for 2 hours, the film for back surface of flip-chip semiconductor was peeled off from the polyethylene terephthalate film, and a volume was measured with a ruler. Then, an amount of shrinkage (% by volume) after thermal curing relative to the whole volume before thermal curing was determined. The results are shown in the following Table 3.

(Warp Amount of Semiconductor Package)

The presence or absence of the generation of a warp of the semiconductor chip was evaluated by measuring a warp amount of the semiconductor chip.

That is, first of all, after peeling off the separator from the dicing tape-integrated film for back surface of semiconductor, a semiconductor wafer (diameter: 8 inches, thickness: 200 μm; a silicon mirror wafer) was stuck onto the film for back surface of semiconductor by means of roll press bonding at 70° C. Furthermore, dicing of the semiconductor wafer was performed. The dicing was performed as full cutting so as to have a chip size of 10 mm square. Incidentally, a sticking condition and a dicing condition are as follows.

[Sticking Condition]

Sticking apparatus: A trade name: "MA-3000III", manufactured by Nitto Seiki Co., Ltd.
Sticking speed: 10 mm/min
Sticking pressure: 0.15 MPa
Stage temperature at the time of sticking: 70° C.

[Dicing Condition]

Dicing apparatus: A trade name; "DFD-6361", manufactured by DISCO Corporation
Dicing ring: "2-8-1" (manufactured by DISCO Corporation)
Dicing speed: 30 mm/sec
Dicing blade:
Z1: "203O-SE 27HCDD", manufactured by DISCO Corporation
Z2: "203O-SE 27HCBB", manufactured by DISCO Corporation
Dicing blade rotation number:
Z1: 40,000 r/min
Z2: 45,000 r/min
Cutting system: Step cutting
Wafer chip size: 10.0 mm square Subsequently, the semiconductor chip obtained by dicing was picked up from the pressure-sensitive adhesive layer together with the film for back surface of flip-chip semiconductor by pushing up from the dicing tape aide of the dicing tape-integrated film for back surface of semiconductor with a needle. A picking-up condition is as follows.

[Picking-up Condition]

Picking-up apparatus: A trade name: "SPA-300", manufactured by Shinkawa Co., Ltd.
Number of picking-up needles: 9 needles
Pushing-up speed of needle: 20 mm/s
Pushing-up distance of needle: 500 μm
Picking-up time: 1 second
Dicing tape expanding amount: 3 mm Subsequently, the semiconductor chip was flip-chip bonded onto a BT substrate [BT RESIN (bismaleimide triazine based resin), manufactured by Mitsubishi Gas Chemical Company, Inc.]. At that time, the circuit face of the semiconductor chip was made opposite to the BT substrate, thereby bringing the bump formed on the circuit face of the semiconductor chip into contact with an electrically conductive material for (solder) for joining as adhered onto a connecting pad of the BT substrate, and the temperature was elevated to 260° C. while pressing, to melt the electrically conductive material, followed by cooling to room temperature. Furthermore, an underfill material as an encapsulating resin was injected into a gap between the semiconductor chip and the BT substrate. At that time, a thickness of the underfill (encapsulating material) was 20 μm. Subsequently, the semiconductor package was heated under a condition at 165° C. for 2 hours and then measured for a warp amount thereof.

As for the measurement of the warp amount, first of all, the semiconductor package was placed on a flat plate such that the BT substrate was faced downward, and a height of the BT substrate lifting up from the flat plate, namely a warp amount (μm) was measured. The measurement was carried out under a condition at a measuring speed of 1.5 mm/s and a load of 1 g by using a contact type surface roughness tester (DEK-TAK8, manufactured by Veeco Instruments Inc.). As a result of the measurement, the case where the warp amount was not more than 100 μm is evaluated as "o", and the case where the warp amount exceeded 100 μm is evaluated as "x". The results are shown in the following Table 3.

TABLE 3

| | Proportion of thermal curing-accelerating catalyst (% by weight) | Amount of thermal curing shrinkage (% by volume) | Thickness of film for back surface of semi-conductor (μm) | Warp amount of semiconductor element |
|---|---|---|---|---|
| Example 5 | 2.0 | 2.5 | 3.0 | o |
| Example 6 | 1.5 | 2.1 | 3.0 | o |

(Results)

As is noted from Table 3, it was confirmed that as shown in Examples 5 and 6, in the films for back surface of semiconductor in which the proportion of the thermal curing-accelerating catalyst was 1.5% by weight or more relative to a total amount of the thermosetting resin, all of the warp amounts of the semiconductor packages could be suppressed to not more than 100 μm.

While the present invention has been described in detail and with reference to specific embodiments thereof, it will be apparent to one skilled in the art that various changes and modifications can be made therein without departing from the scope thereof.

This application is based on Japanese patent application No. 2010-097229 filed Apr. 20, 2010, Japanese patent application No. 2010-097236 filed Apr. 20, 2010, and Japanese patent application No. 2010-097240 filed Apr. 20, 2010, the entire contents thereof being hereby incorporated by reference.

INDUSTRIAL APPLICABILITY

According to the film for back surface of flip-chip semiconductor according to the present invention, since it is formed on the back surface of a semiconductor element having been flip-chip connected onto an adherend, it fulfills a function to protect the semiconductor element. In addition, in the film for back surface of flip-chip semiconductor according to the present invention, an amount of shrinkage due to thermal curing is 2% by volume or more relative to a total volume of the film for back surface of flip-chip semiconductor before thermal curing, and therefore, a warp of a semiconductor element generated at the time of flip-chip connecting the semiconductor element onto an adherend can be effectively suppressed or prevented.

EXPLANATIONS OF REFERENCE NUMERALS AND SIGNS

1: Dicing tape-integrated film for back surface of semiconductor
2: Film for back surface of semiconductor
3: Dicing tape
31: Base material
32: Pressure-sensitive adhesive layer
33: Portion corresponding to sticking portion of semiconductor wafer
4: Semiconductor wafer
5: Semiconductor chip
51: Bump formed on the circuit face side of semiconductor chip 5
6: Adherend
61: Electrically conductive material for joining as adhered onto connecting pad of adherend 6

The invention claimed is:

1. A method for manufacturing a semiconductor device comprising:
   a step of sticking a semiconductor wafer onto a film for back surface of flip-chip semiconductor in a dicing tape-integrated film for back surface of semiconductor;
   wherein the dicing tape-integrated film for back surface of semiconductor comprises a dicing tape including a base material and a pressure-sensitive adhesive layer laminated on the base material, and the film for back surface of flip-chip semiconductor laminated on the pressure-sensitive adhesive layer, and
   wherein an amount of shrinkage of the film for back surface of flip-chip semiconductor due to thermal curing is 2% by volume or more and not more than 30% by volume relative to a total volume of the film for back surface of flip-chip semiconductor before the thermal curing;
   a step of dicing the semiconductor wafer to form a semiconductor element;
   a step of peeling off the semiconductor element together with the film for back surface of flip-chip semiconductor from the pressure-sensitive adhesive layer of the dicing tape; and
   a step of flip-chip connecting the semiconductor element onto an adherend,
   wherein the step of flip-chip connection includes a step of encapsulating an encapsulating resin in a gap between the semiconductor element flip-chip bonded onto the adherend and the adherend, followed by thermally curing the encapsulating resin and the film for flip chip type semiconductor back surface simultaneously.

2. A flip-chip semiconductor device manufactured by the method for manufacturing a semiconductor device according to claim 1.

3. The method according to claim 1, wherein the film for back surface of flip-chip semiconductor contains at least a thermosetting resin.

4. The method according to claim 1, wherein a content of the thermosetting resin is 40% by weight or more and not more than 90% by weight relative to whole resin components in the film for back surface of flip-chip semiconductor.

5. The method according to claim 1, wherein the film for back surface of flip-chip semiconductor further contains a thermal curing-accelerating catalyst, wherein a proportion of the thermal curing-accelerating catalyst is 1.5% by weight or more and not more than 20% by weight relative to a total amount of the thermosetting resin.

6. The method according to claim 4, wherein the film for back surface of flip-chip semiconductor further contains a thermal curing-accelerating catalyst, wherein a proportion of the thermal curing-accelerating catalyst is 1.5% by weight or more and not more than 20% by weight relative to a total amount of the thermosetting resin.

7. The method according to claim 1, wherein a thickness of the film for back surface of flip-chip semiconductor falls within a range of from 2 μm to 200 μm.

8. The method according to claim 1, wherein a thickness of the semiconductor element falls within a range of from 20 μm to 300 μm.

* * * * *